(12) United States Patent
Ware et al.

(10) Patent No.: US 12,688,884 B2
(45) Date of Patent: Jul. 21, 2026

(54) VARIABLE WIDTH MEMORY MODULE SUPPORTING ENHANCED ERROR DETECTION AND CORRECTION

(71) Applicant: Rambus Inc., San Jose, CA (US)

(72) Inventors: Frederick A. Ware, Los Altos Hills, CA (US); John Eric Linstadt, Palo Alto, CA (US); Kenneth L. Wright, Sunnyvale, CA (US)

(73) Assignee: Rambus Inc., San Jose, CA (US)

( * ) Notice: Subject to any disclaimer, the term of this patent is extended or adjusted under 35 U.S.C. 154(b) by 126 days.

(21) Appl. No.: 18/634,799

(22) Filed: Apr. 12, 2024

(65) Prior Publication Data

US 2024/0321339 A1 Sep. 26, 2024

Related U.S. Application Data

(63) Continuation of application No. 18/203,511, filed on May 30, 2023, now Pat. No. 11,967,364, which is a continuation of application No. 17/501,311, filed on Oct. 14, 2021, now Pat. No. 11,705,187, which is a continuation of application No. 17/101,574, filed on Nov. 23, 2020, now Pat. No. 11,164,622, which is a continuation of application No. 16/856,596, filed on Apr. 23, 2020, now Pat. No. 10,878,888, which is a
(Continued)

(51) Int. Cl.
| | |
|---|---|
| *G06F 11/10* | (2006.01) |
| *G11C 7/02* | (2006.01) |
| *G11C 11/4093* | (2006.01) |
| *G11C 11/4096* | (2006.01) |
| *G11C 29/04* | (2006.01) |
| *G11C 29/52* | (2006.01) |

(52) U.S. Cl.
CPC ...... *G11C 11/4093* (2013.01); *G06F 11/1048* (2013.01); *G11C 7/02* (2013.01); *G11C 11/4096* (2013.01); *G11C 29/52* (2013.01); *G11C 2029/0411* (2013.01)

(58) Field of Classification Search
CPC ............ G11C 11/4093; G11C 11/4096; G11C 2029/0411; G11C 29/52; G11C 7/02; G06F 11/1048
USPC ..................................................... 365/189.02
See application file for complete search history.

(56) References Cited

U.S. PATENT DOCUMENTS

| | | |
|---|---|---|
| 5,204,841 A | 4/1993 | Chappell et al. |
| 6,134,638 A | 10/2000 | Olarig et al. |

(Continued)

OTHER PUBLICATIONS

Advanced Micro Devices, "BIOS and Kernel Developer's Guide (BKDG) for AMD Family 10h Processors", Rev. 3.62, Jan. 11, 2013, pp. 1-475. 475 pages.

(Continued)

*Primary Examiner* — Ly D Pham
(74) *Attorney, Agent, or Firm* — Silicon Edge Law Group LLP; Arthur J. Behiel

(57) ABSTRACT

Described are memory modules that support different error detection and correction (EDC) schemes in both single- and multiple-module memory systems. The memory modules are width configurable and support the different EDC schemes for relatively wide and narrow module data widths. Data buffers on the modules support the half-width and full-width modes, and also support time-division-multiplexing to access additional memory components on each module in support of enhanced EDC.

12 Claims, 20 Drawing Sheets

Related U.S. Application Data continuation of application No. 16/440,015, filed on Jun. 13, 2019, now Pat. No. 10,650,881, which is a continuation of application No. 16/011,539, filed on Jun. 18, 2018, now Pat. No. 10,339,999, which is a continuation of application No. 15/610,001, filed on May 31, 2017, now Pat. No. 10,014,047, which is a continuation of application No. 15/262,741, filed on Sep. 12, 2016, now Pat. No. 9,697,884.

(60) Provisional application No. 62/239,158, filed on Oct. 8, 2015.

(56) References Cited

U.S. PATENT DOCUMENTS

| | | | |
|---|---|---|---|
| 6,493,843 B1 | 12/2002 | Raynham | |
| 6,502,161 B1 | 12/2002 | Perego et al. | |
| 6,643,752 B1 | 11/2003 | Donnelly et al. | |
| 6,839,266 B1 | 1/2005 | Garrett, Jr. et al. | |
| 6,876,678 B1 | 4/2005 | Chow et al. | |
| 7,096,407 B2 | 8/2006 | Olarig | |
| 7,120,727 B2 | 10/2006 | Lee et al. | |
| 7,136,958 B2 | 11/2006 | Jeddeloh | |
| 7,464,225 B2 | 12/2008 | Tsern | |
| 7,580,309 B2 | 8/2009 | Yang et al. | |
| 7,694,093 B2 | 4/2010 | Shaw et al. | |
| 7,779,215 B2 | 8/2010 | Liou et al. | |
| 7,836,213 B2 | 11/2010 | Vashisth et al. | |
| 8,098,539 B2 | 1/2012 | Sankuratri et al. | |
| 8,108,607 B2 | 1/2012 | Shaeffer et al. | |
| 8,112,608 B2 | 2/2012 | Perego et al. | |
| 8,130,560 B1 | 3/2012 | Rajan et al. | |
| 8,140,937 B2 | 3/2012 | Dasari et al. | |
| 8,321,756 B2 | 11/2012 | Rueping et al. | |
| 8,484,410 B2 | 7/2013 | Bains et al. | |
| 8,788,904 B2 | 7/2014 | Li et al. | |
| 9,026,714 B2 | 5/2015 | Peterson et al. | |
| 9,430,324 B2 | 8/2016 | Ware et al. | |
| 9,697,884 B2 | 7/2017 | Ware et al. | |
| 10,014,047 B2 | 7/2018 | Ware et al. | |
| 10,339,999 B2 | 7/2019 | Ware et al. | |
| 2001/0029571 A1 | 10/2001 | Shibayama | |
| 2006/0277355 A1 | 12/2006 | Ellsberry et al. | |
| 2008/0016254 A1 | 1/2008 | Kruger et al. | |
| 2008/0080261 A1 | 4/2008 | Shaeffer et al. | |
| 2008/0270649 A1 | 10/2008 | Pearson et al. | |
| 2009/0063785 A1 | 3/2009 | Gower et al. | |
| 2010/0149427 A1 | 6/2010 | Limberg | |
| 2012/0234831 A1 | 9/2012 | Lin | |
| 2013/0111122 A1 | 5/2013 | Song et al. | |
| 2014/0185226 A1 | 7/2014 | Lam et al. | |
| 2014/0351629 A1 | 11/2014 | Ware et al. | |
| 2015/0100746 A1 | 4/2015 | Rychlik et al. | |
| 2015/0223333 A1 | 8/2015 | Ware et al. | |
| 2016/0232112 A1 | 8/2016 | Lee | |

OTHER PUBLICATIONS

Jacob, Bruce et al., "High-Speed Memory Systems", University of Crete/University of Maryland CS-590.26 Lecture F, Spring 2014. 25 Pages.

Locklear, David, "Chipkill Correct Memory Architecture", Dell. com Technology Brief, pp. 1-4, Aug. 2000. 4 Pages.

Wikipedia, "Error Detection and Correction", https://en.wikipedia. org/wiki/Error_detection_and_correction, pp. 1-7, Aug. 31, 2015. 7 Pages.

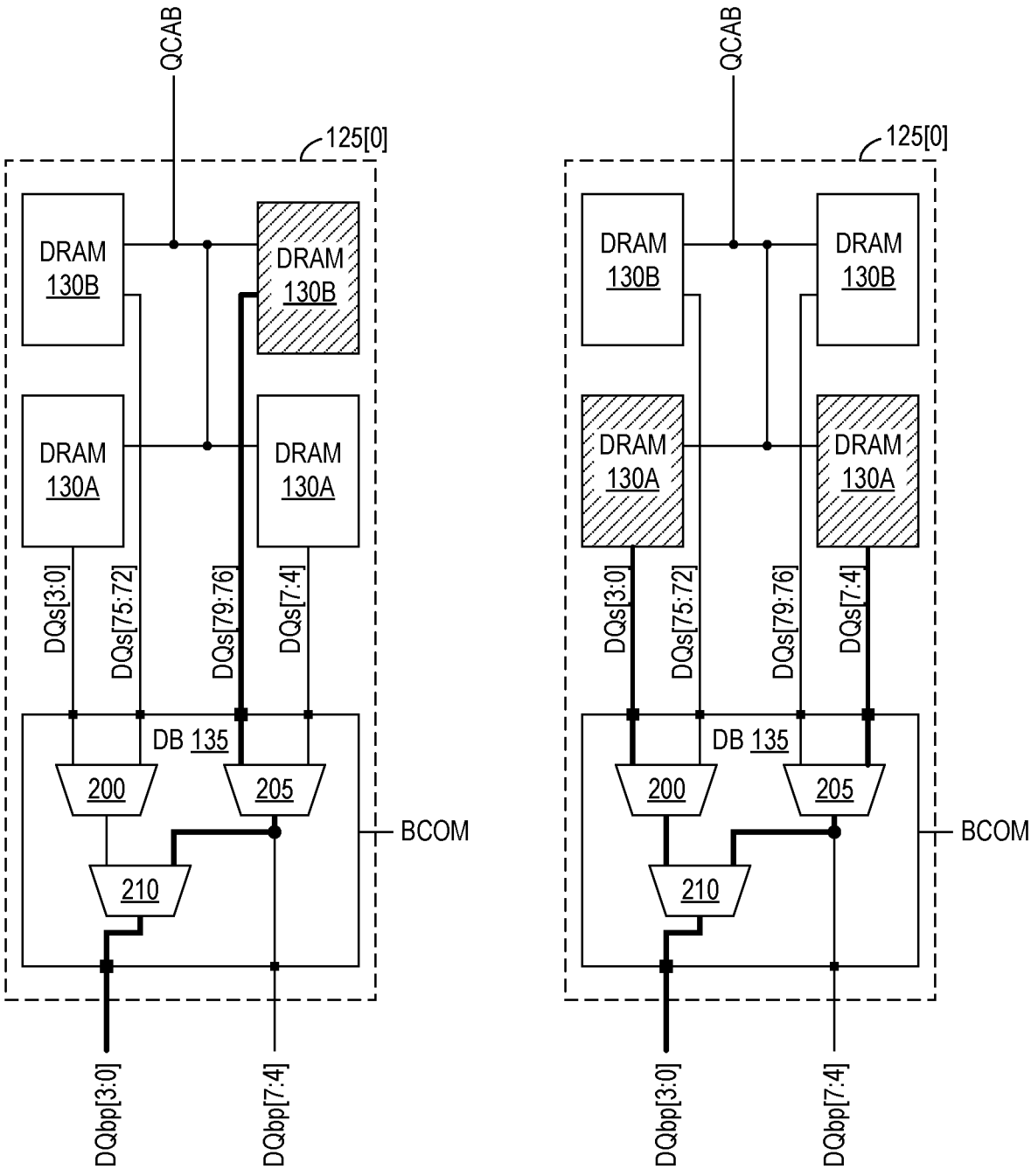
FIG. 6A                    FIG. 7A

VARIABLE WIDTH MEMORY MODULE SUPPORTING ENHANCED ERROR DETECTION AND CORRECTION

FIELD OF THE INVENTION

The subject matter presented herein relates generally to computer memory.

BACKGROUND

Personal computers, workstations, and servers include at least one processor, such as a central processing unit (CPU), and some form of memory system that includes dynamic, random-access memory (DRAM). The processor executes instructions and manipulates data stored in the DRAM.

DRAM stores binary bits by alternatively charging or discharging capacitors to represent the logical values one and zero. The capacitors are exceedingly small, and their stored charges can be upset by electrical interference or high-energy particles. The resultant changes to the stored instructions and data produce undesirable computational errors.

Some computer systems, such as high-end servers, employ various forms of error detection and correction to manage DRAM errors, or even more permanent memory failures. The general idea is to add storage for extra information that can be used to identify or correct for errors. By way of example, conventional servers that support error correction commonly include pairs of memory modules, each of which provides burst of 72-bit data for each memory access, for a total of 144 bits. Sixteen of these bits are used for error correction, so that each memory access effectively provides 128 bits of information. This level of redundancy allows support for error detection and correction (EDC) robust enough to correct for any single DRAM device failure, and any multi-bit errors from any portion of a single DRAM device. An exemplary EDC technology of this type is marketed under the trademark Chipkill™.

BRIEF DESCRIPTION OF THE DRAWINGS

FIG. 6A depicts memory slice 125[0] with one DRAM component 130B and a subset of the signal lines highlighted to illustrate how multiplexers 200, 205, and 210 convey data between primary data link group DQp[3:0] and one DRAM component in a half-width mode.

FIG. 7A depicts memory slice 125[0] with DRAM components 130A and the signal lines highlighted to illustrate how multiplexers 200, 205, and 210 convey data between primary link group DQp[3:0] and a pair of DRAM components in a half-width TDM mode that supports enhanced EDC.

FIG. 9A depicts a memory system 900 similar to system 500 of FIG. 5A, with like-identified elements being the same or similar.

DETAILED DESCRIPTION

Figure 1:
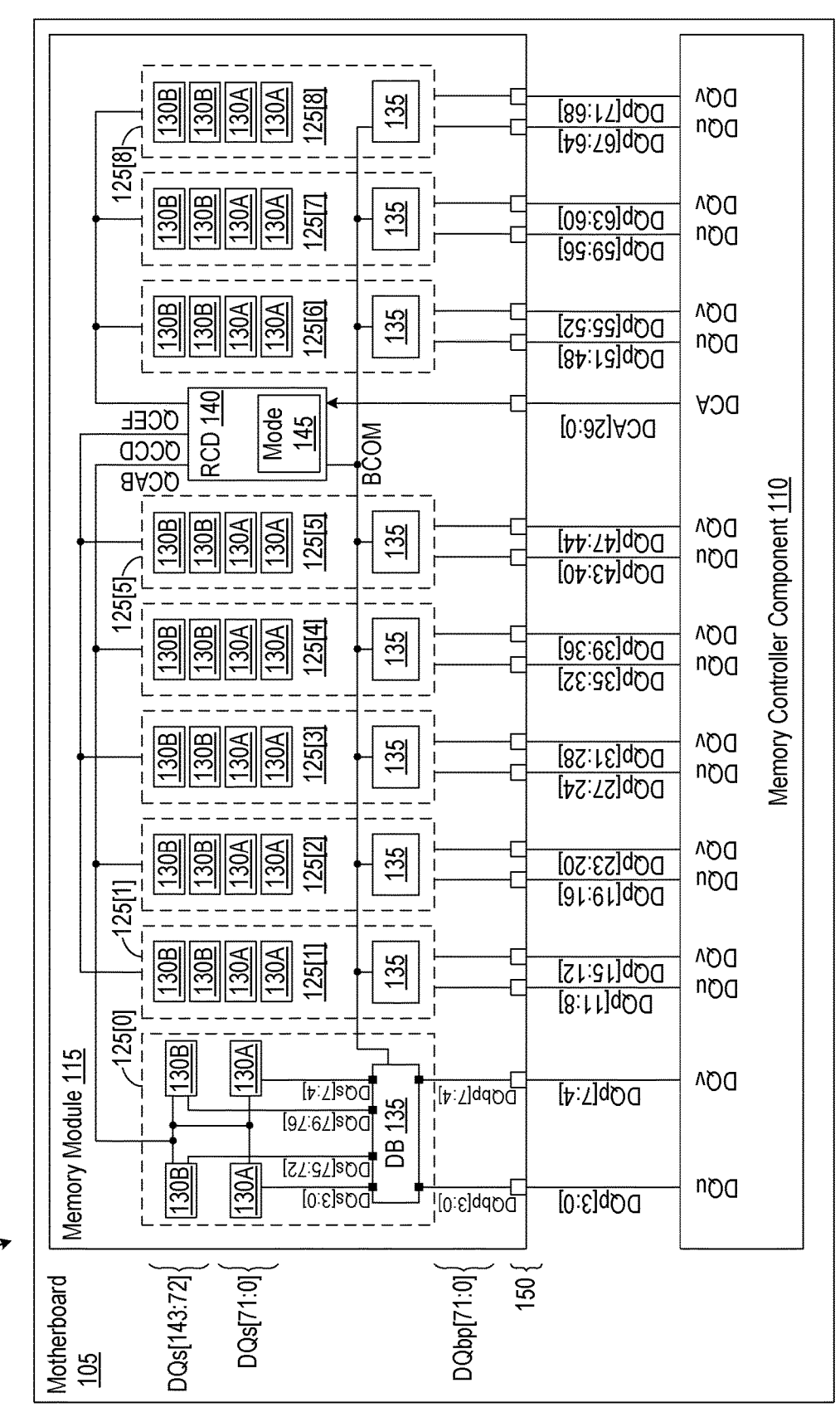
FIG. 1 depicts a memory system 100 in which a motherboard 105 supports a memory-controller component 110 that communicates with a memory module 115 via nine pairs of nibble-wide primary data ports DQu/DQv and a primary command-and-address (CA) port DCA.

FIG. 1 depicts a memory system 100 in which a motherboard 105 supports a memory-controller component 110 that communicates with a memory module 115 via nine pairs of nibble-wide primary data ports DQu/DQv and a primary command-and-address (CA) port DCA. The eighteen data ports DQu and DQv are connected to module 115 via four-trace subsets of seventy-two primary data links DQp [71:0]; CA port DCA conveys module commands via primary CA link group DCA[26:0].

Memory module 115 includes nine memory slices 125[8:0], each of which includes four DRAM components 130 and a data-buffer component 135. DRAM components 130 are divided into an anterior pair 130A and a posterior pair 130B, where "anterior" and "posterior" refer to the two sides of memory module 115. Seventy-two secondary data links DQs[71:0] connect DRAM components 130A to data-buffer components 135, and another seventy-two secondary data links DQs[143:72] likewise connect DRAM components 130B to data-buffer components 135. Each data-buffer component 135 selectively conveys data between one or more of four nibble-wide secondary link groups DQs and a pair of the nibble-wide primary data link groups DQbp. Considering memory slice 125[0], for example, data buffer 135 communicates data between secondary link groups DQs[3:0], DQs[7:4], DQs[75:72], and DQs[79:76] and primary link groups DQbp[3:0] and DQbp[7:4].

An address-buffer component 140, alternatively called a "Registered Clock Driver" (RCD), relays module commands received from controller component 110 via primary address interface DCA[26:0] to each memory component 130 via one of three secondary command interfaces QCAB, QCCD, and QCEF. Address-buffer component 140 also controls the flow of data through data-buffer components 135 via a common buffer interface BCOM.

Memory module 115 supports multiple operational modes that offer different levels of error detection and correction. In a first access mode, each data-buffer component 135 communicates pairs of four-bit (x4) data nibbles, in four-pair bursts, between respective link groups DQu and DQv of controller component 110 and a corresponding pair of DRAM components 130. Responsive to a read command from controller component 110, for example, slice 125[0] delivers a four-bit burst of nibble-wide (four-bit) data from each of DRAM components 130A or 130B to controller component 110 via two primary link groups DQp[3:0] and DQp[7:4]. With nine such slices 120[8:0], each read command thus provides controller component 110 with eighteen data nibbles (72-bits) in four-bit bursts. Of each set of 72-bits, eight are for error-correcting code (ECC). The redundancy provided by the additional eight bits provides for automatic correction for single-bit data errors, and guaranteed detection of two-bit data errors.

Memory module 115 also supports a second access mode that supports enhanced error correction. In this second mode, each data-buffer component 135 employs time-division multiplexing (TDM) to communicate pairs of data nibbles, in eight-pair bursts, between respective link groups DQu and DQv of controller component 110 and both pairs of DRAM components 130A and 130B. Considering only the lowest-order primary link group DQp[3:0], for example, data-buffer component 135 of slice 125[0] interleaves bursts of four nibbles on secondary interfaces DQs[3:0] and DQs [75:72] to deliver a burst of eight nibbles on primary link group DQp[3:0]; and similarly interleaves bursts of four nibbles on secondary interfaces DQs[79:76] and DQs[7:4] to deliver a burst of eight nibbles on primary link group DQp[7:4]. There being nine slices 125[8:0], each read command thus provides controller component 110 with eight bursts of eighteen data nibbles (72-bits). Controller component 110 groups the resultant eight sets of 72-bit data into four sets of 144-bit data, of which sixteen bits of each set are used for error correction. This level of redundancy allows support for error detection and correction (EDC) robust enough to correct for any single DRAM device failure, and any multi-bit errors from any portion of a single DRAM device. An exemplary EDC technology of this type is marketed under the trademark Chipkill™.

Address buffer 140 directs the different modal behavior of slices 125[8:0] by providing control instructions to data-buffer components 135 via a buffer command bus BCOM. Module 115 can be statically configured at initialization to enter one of the modes by e.g. setting a configuration field in a mode register 145. Mode register 145 can be loaded by a slow signal interface (based on information stored in a serial Presence Device (SPD) via an SPD bus, an I2C bus, or something similar), or by a high-speed bus (e.g., via the DCA group). Mode register 145 can be located elsewhere, or mode configuration can be accomplished using e.g. a configuration pin or jumper.

Each data-buffer component 135 includes two four-bit primary data ports coupled to a respective pair of link groups DQu and DQv via a primary data interface 150. Each of slices 125[8:0] communicates word-wide (eight-bit) data, so memory module 115 communicates with controller component 110 via seventy-two traces DQbp[71:0]. On the other side of data-buffer components 135, the eighteen anterior DRAM components 130A provide the low-order secondary data bits DQs[71:0] and posterior DRAM components 130B the high-order secondary data bits DQs[143:72]. In slice 125[0], for example, data-buffer component 135 includes four nibble-wide secondary data ports DQs[3:0], DQs[7:4], DQs[75:72], and DQs[79:76].

Figure 2:
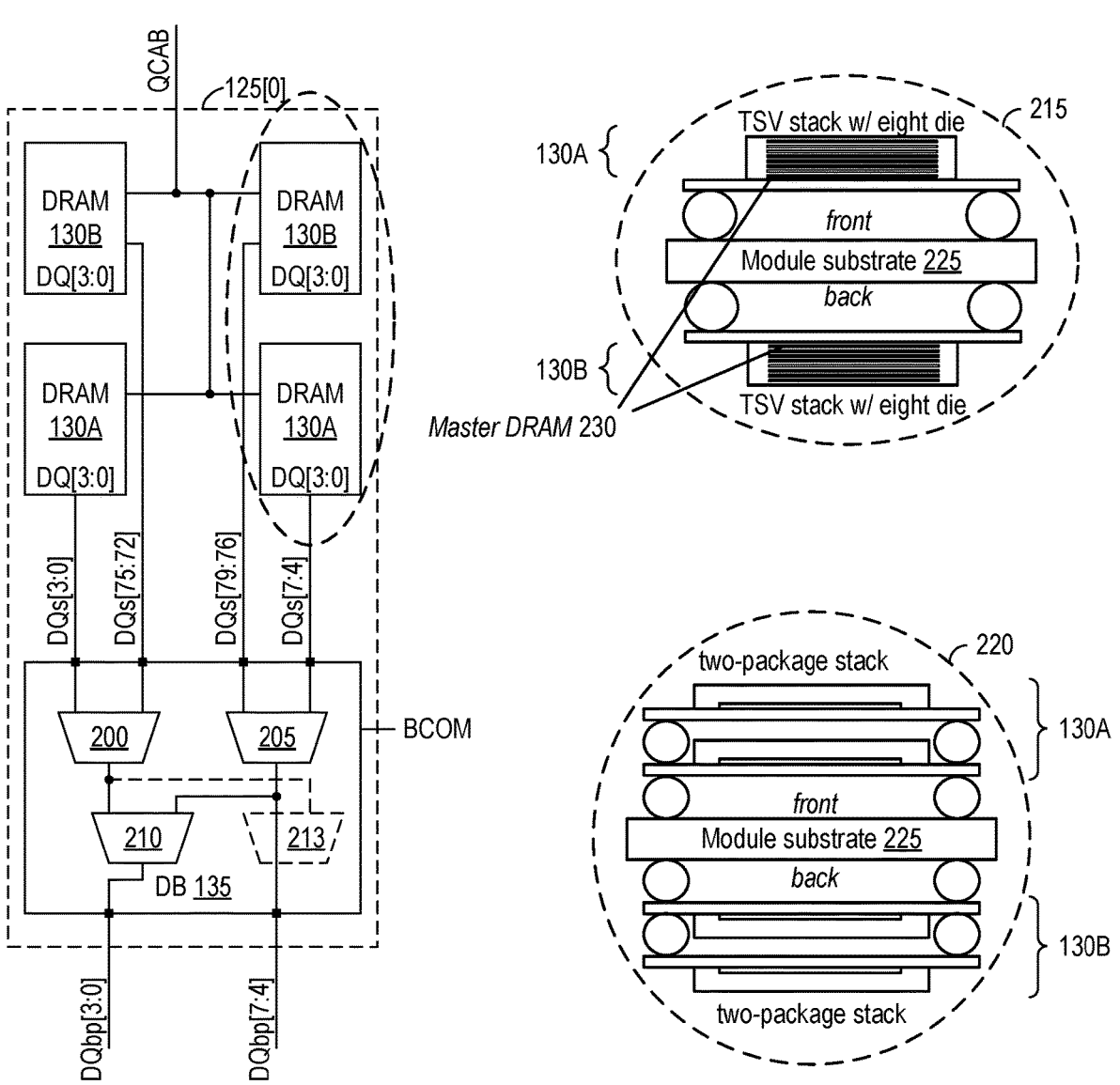
FIG. 2 depicts memory slice 125[0] of FIG. 1 in accordance with one embodiment.

FIG. 2 depicts memory slice 125[0] of FIG. 1 in accordance with one embodiment. Each of DRAM components 130A and 130B includes a memory-component interface DQ[3:0] connected to data-buffer component 135 via a respective one of the four secondary data link groups DQs[3:0], DQs[7:4], DQs[75:72], and DQs[79:76].

Data-buffer component 135 includes multiplexing logic that is represented here using three multiplexers 200, 205, and 210. The following examples illustrate data flow in the read direction, from memory components 130A and 130B to primary traces DQbp[7:0] responsive to read commands from controller component 110. Multiplexers 200 and 205 support the two modes detailed previously. That is, multiplexers 200 and 205 can present data from either pair of DRAM components 130A or 130B as a burst of four eight-bit words on port DQbp[7:0] or can present data from both pairs of DRAM components 130A and 130B as burst of eight eight-bit words on port DQbp[7:0]. Write data is conveyed similarly in the respective modes, but from controller component 110 to the DRAM components 130A and 130B. Data steering and timing are controlled by address-buffer component 140 via communication bus BCOM.

The third multiplexer 210 supports narrow data modes to be detailed later. Briefly, a first narrow mode allows four-bit data from any one of the four DRAM components 130A and 130B to be presented on the low-order primary link group DQbp[3:0]; a second narrow mode allows four-bit data from two of DRAM components 130A and 130B to be time-division multiplexed and presented sequentially or interleaved on the low-order primary link group DQbp[3:0] responsive to a single memory command; and a third narrow mode is like the second but the primary link group DQbp [3:0] operates at twice the bit rate of the secondary link groups to the DRAM components. An optional multiplexer 213 allows narrow data to be presented on either of the low- and high-order primary buffer link groups DQbp[3:0] and DQbp[7:4] from any of secondary link groups DQs[3:0], DQs[7:4], DQs[75:72], and DQs[79:76] to provide greater routing flexibility.

FIG. 2 additionally shows alternative arrangements 215 and 220 for pairs of DRAM components 130A and 130B in cross section. Arrangement 215 includes two stacks of eight DRAM dies interconnected by e.g. through-silicon vias. Stacks of components 130A and 130B are on either side of module substrate 225, and each includes a master die 230 with the requisite data-buffer logic. In the other illustrated alternative arrangement 220, DRAM components 130A and 130B are two-package stacks, one on either side of module substrate 225. Other alternative arrangements, with the same or different numbers of dies or packages, can also be used.

Figures 3A, 4A:
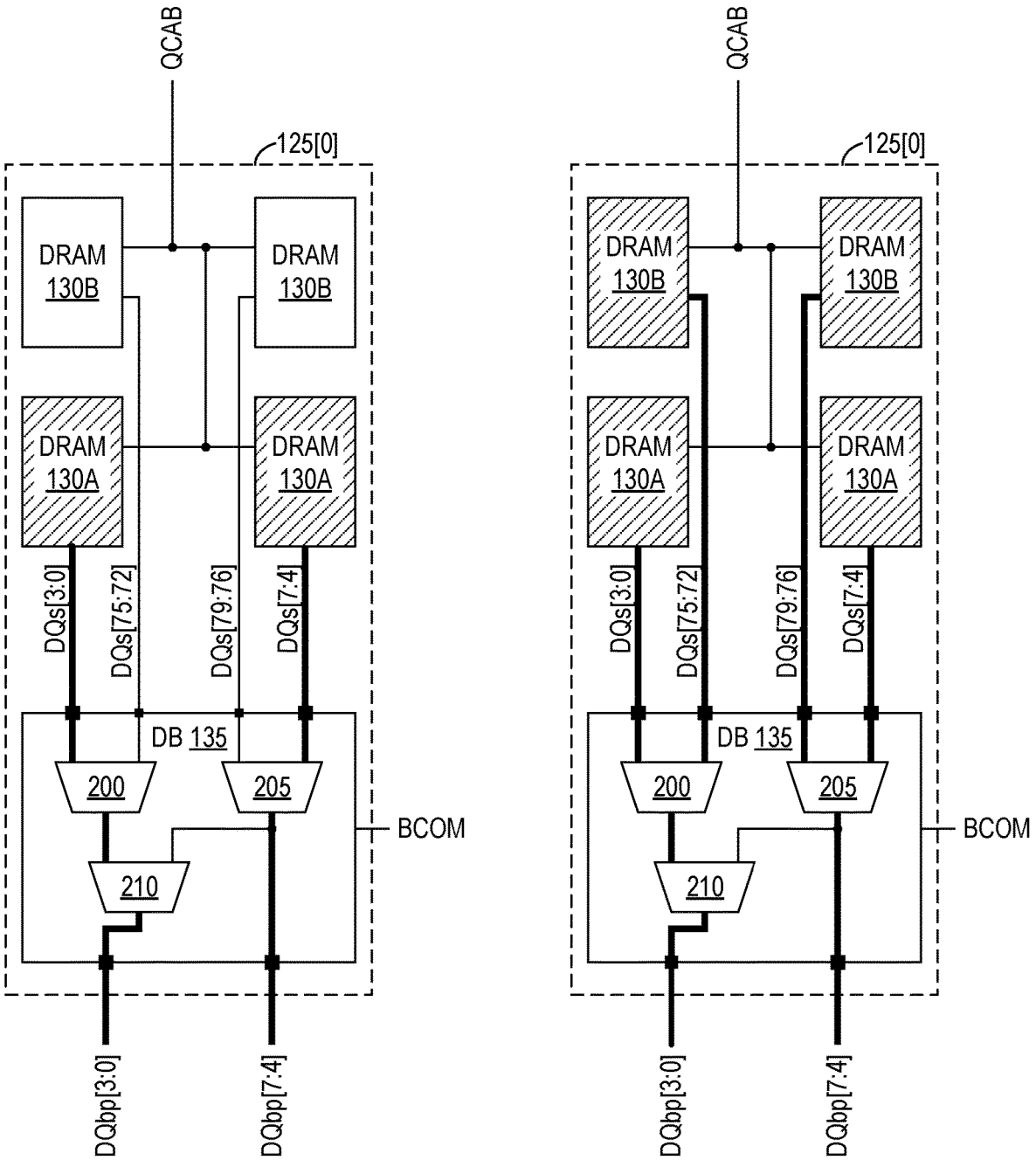
FIG. 3A depicts memory slice 125[0] with DRAM components 130A and a subset of the signal lines highlighted to illustrate how multiplexers 200, 205, and 210 convey data between primary data traces DQp and pairs of DRAM components 130.
FIG. 4A depicts memory slice 125[0] with DRAM components 130A and the signal lines highlighted to illustrate how multiplexers 200, 205, and 210 convey data between primary data traces DQp and pairs of DRAM components in a time-division-multiplexing (TDM) mode that can be used for enhanced EDC.

FIG. 3A depicts memory slice 125[0] with DRAM components 130A and a subset of the signal lines highlighted to illustrate how multiplexers 200, 205, and 210 convey data between primary data traces DQbp and pairs of DRAM components 130. Secondary command interface QCAB includes chip-select (CS) lines (FIG. 8), which select DRAM devices (FIG. 8) in one of the two pairs of DRAM components, one device in each of components 130A in this example. Responsive to signals on buffer control interface BCOM, multiplexers 200, 205, and 210 communicate read and write data between primary link group DQbp[3:0] and the leftmost selected DRAM component 130A and between primary link group DQbp[7:4] and the rightmost selected DRAM component 130A. Should DRAM components 130B be selected, then multiplexers 200 and 205 would select their alternative connections. Each of slices 125[8:0] thus communicates a burst of four eight-bit words for each read or write transaction initiated by controller component 110. In this context, a "transaction" is an atomic interaction a memory controller initiates by issuing a memory command (e.g., read or write) to cause one or more memory modules to store or provide data.

Figure 3B:
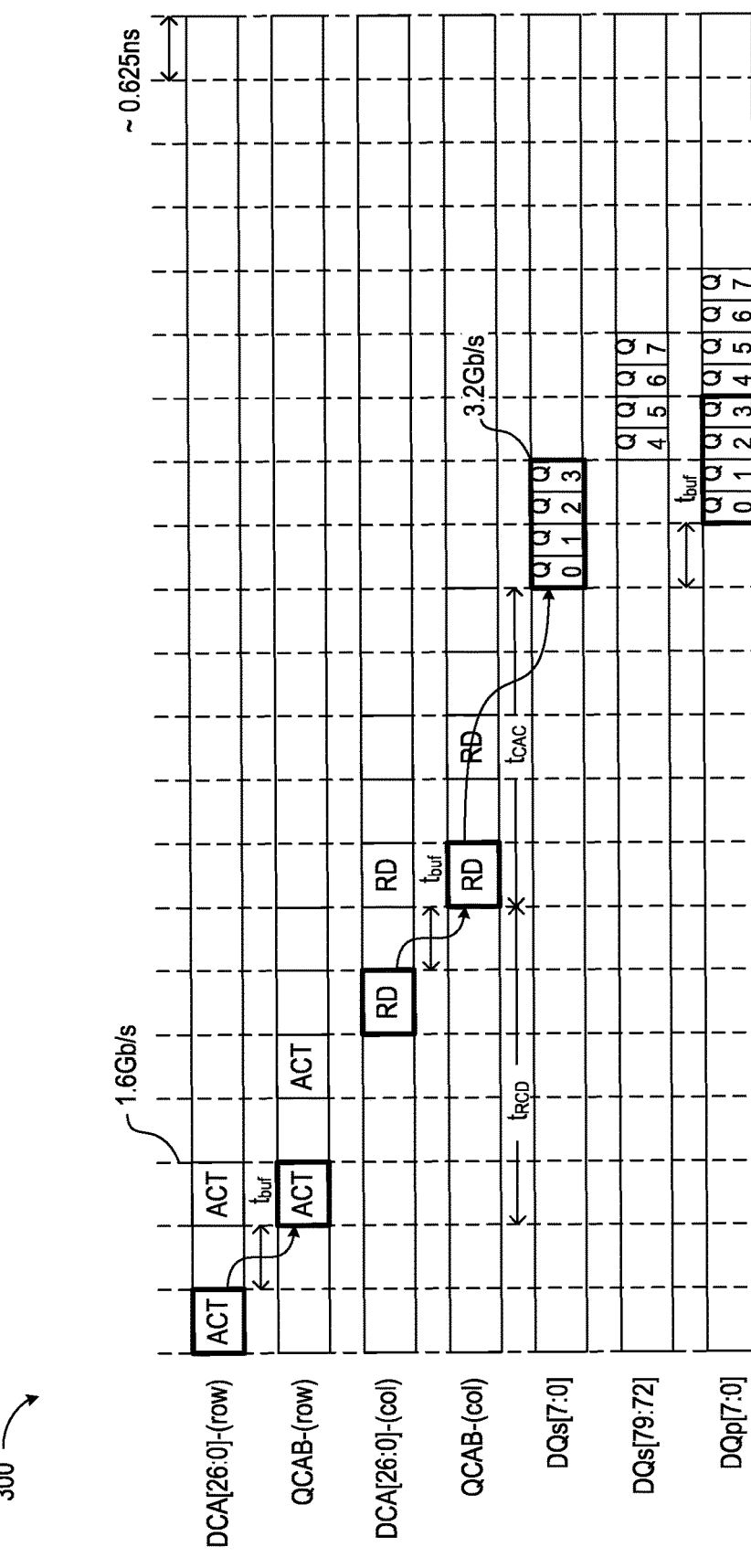
FIG. 3B is a waveform diagram 300 illustrating successive read transactions directed to memory slice 125[0] configured as illustrated in FIG. 3A.

FIG. 3B is a waveform diagram 300 illustrating successive read transactions directed to memory slice 125[0] configured as illustrated in FIG. 3A. Signals associated with the first read transaction are encompassed in bold boundaries to distinguish them from those of the second read transaction.

To begin, controller component 110 issues an activate command ACT to module 115 via CA traces DCA[26:0] to activate a row of memory cells (not shown) in a pair of DRAM components, anterior components 130A in this example. Address buffer 140 buffers these signals and, after a delay time $t_{buf}$, issues them to each slice 125[8:0] via the three secondary command interfaces QCAB, QCCD, and QCEF. These secondary interfaces are identical, with each serving three sets of memory slices 125. This example focuses on slice 125[0] for simplicity, so FIG. 3B only shows the signals presented on secondary command interface QCAB.

Having activated a row of memory cells, controller component 110 issues a read command RD. Address buffer 140 buffers these signals and issues them to each of slices 125[8:0] via the three secondary command interfaces QCAB, QCCD, and QCEF to select columns of the memory cells within the active rows. The activate and read commands ACT and RD on secondary command interface QCAB are separated by the row-cycle to column-cycle delay time $t_{RCD}$, and the selected memory components 130A present their data on secondary interface DQs[7:0] after a column-access delay $t_{CAC}$. Data-buffer component 135 conveys the read data from the active rows and columns of DRAM components 130A via lines DQs[7:0] of the secondary data interface and conveys it to controller component 110 via traces DQp[7:0] of the primary data interface. In this example, the command interfaces operate at 1.6 Gb/s, half the 3.2 Gb/s speed of primary data traces DQp[71:0] and secondary traces DQs[143:0].

In this example, controller component 110 issues second activate and read commands ACT and RD directed to the posterior DRAM components 130B. The signal flow is similar to that discussed above in connection with an access to DRAM components 130A, except that data-buffer component 135 directs data from the high-order secondary data interface DQs[79:72] to traces DQp[7:0] of the primary data interface.

FIG. 4A depicts memory slice 125[0] with DRAM components 130A and the signal lines highlighted to illustrate how multiplexers 200, 205, and 210 convey data between primary data traces DQbp and pairs of DRAM components in a time-division multiplexing (TDM) mode that can be used for enhanced EDC. Slice 125[0] operates in the manner noted above in connection with FIG. 3A, but address-buffer component 140 activates a row in all four DRAM components 130A and 130B to present four-bit data on all four secondary data ports of data-buffer component 135. Data-buffer component 135 interleaves the data from the selected pairs of DRAM components 130 so that slice 125[0] communicates a burst of eight eight-bit words—and module 115 communicates nine bursts of eight eight-bit words—for each read or write transaction initiated by controller component 110.

Figure 4B:
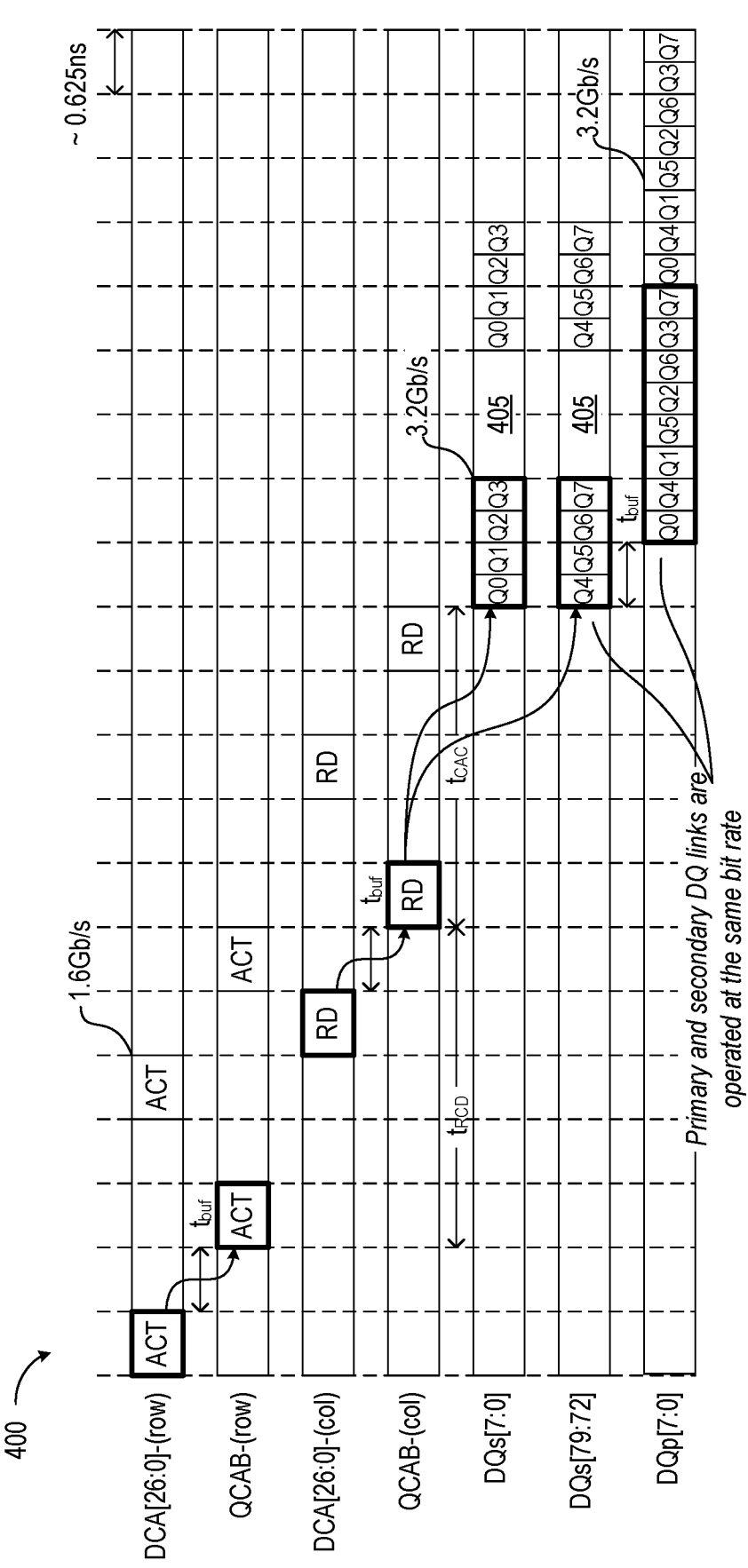
FIG. 4B is a waveform diagram 400 illustrating successive read transitions directed to memory slice 125[0] with memory module 115 in the TDM mode, illustrated in FIG. 4A.

FIG. 4B is a waveform diagram 400 illustrating successive read transitions directed to memory slice 125[0] with memory module 115 in the TDM mode, illustrated in FIG. 4A, that corrects for any single DRAM device failure, and any multi-bit errors from any portion of a single DRAM device (e.g., Chipkill™ EDC). Signals associated with the first read transaction are encompassed in bold boundaries to distinguish them from those of the second read transaction.

To begin, controller component 110 issues an activate command ACT to module 115 via CA traces DCA[26:0] to activate a row of memory cells (not shown) in all four DRAM components 130A and 130B. Address buffer 140 buffers these signals and, after a delay time $t_{buf}$, issues them to each memory slice 125[8:0] via the three secondary command interfaces QCAB, QCCD, and QCEF. As with the example of FIG. 3B, this case focusses on slice 125[0] and so only shows the ACT signals presented on secondary command interface QCAB.

Having activated a row of memory cells, controller component 110 issues a read command RD. Address buffer 140 buffers these signals and issues them to each slice 125[8:0] via the three secondary command interfaces QCAB, QCCD, and QCEF to activate columns of the memory cells within the active rows. Data-buffer component 135 reads a burst of four eight-bit words from each pair of DRAM components 130A and 130B, on respective secondary lines DQs[7:0] and DQs[79:72], and interleaves the resultant data to provide a burst of eight eight-bit words on primary data links DQq[7:0]. As in the example of FIG. 3B, the command interfaces operate at 1.6 Gb/s, half the 3.2 Gb/s speed of primary data links DQp[71:0] and secondary data links DQs[143:0]. "Bubbles" 405 between data bursts on secondary data links DQs[79:72,7:0] accommodate the fact that slice 125[0] has twice as many secondary data links as primary data links.

Figure 4C:
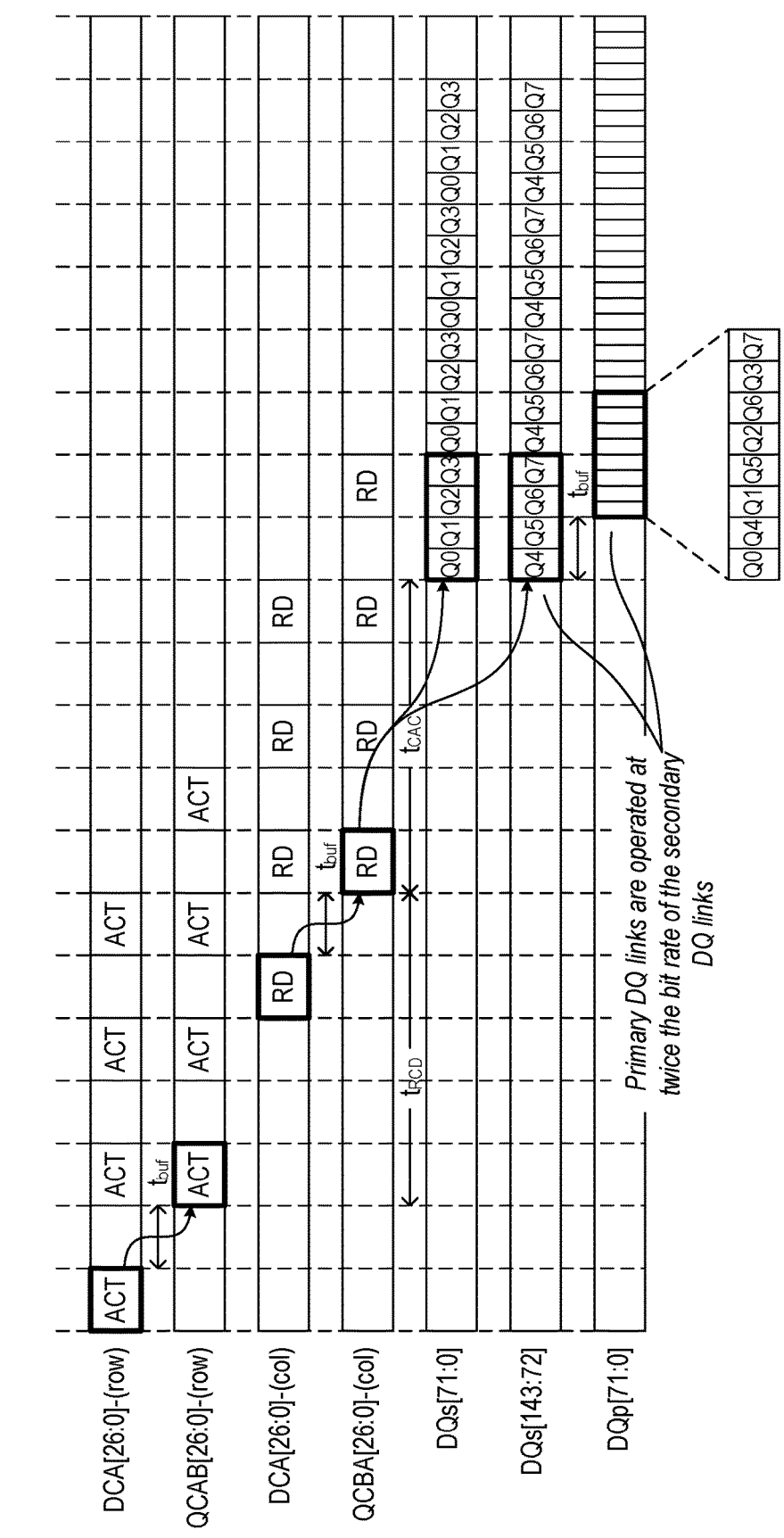
FIG. 4C is a waveform diagram 410 illustrating successive read transactions directed to memory slice 125[0] with memory module 115 in a second TDM mode.

FIG. 4C is a waveform diagram 410 illustrating successive read transactions directed to memory slice 125[0] with memory module 115 in a second TDM mode. Signals associated with the first read transaction are encompassed in bold boundaries to distinguish them from those of the second read transaction. This example is similar to that of FIG. 4B, but buffer 135 communicates over primary links DQp[71:0] at twice the bit rate relative to the bit rate employed with secondary links DQs[143:0]. This embodiment relaxes the speed requirements for DRAM components 130A and 130B, potentially reducing cost, power consumption, or both.

Figure 5A:
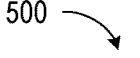
FIG. 5A depicts a memory system 500 in which a computer motherboard (or system backplane) 505 includes module connectors 510 and primary data links DQp[71:0] and DQt[35:0] for connecting one or a pair of modules 115 to memory controller component 110 using point-to-point data connections.

FIG. 5A depicts a memory system 500 in which a computer motherboard (or system backplane) 505 includes module connectors 510 and primary data links DQp[71:0] and DQt[35:0] for connecting one or a pair of modules 115 to memory controller component 110 using point-to-point data connections. System 500 is shown to include a single memory channel, depicted using traces DQp[71:0], but can include additional channels supported by the same or additional memory controllers.

Only half of primary traces DQp[71:0] extend directly—without intermediate components—to each of connectors 510. With reference to controller component 110, the link groups associated with signals DQu and DQv extend to the near and far connectors 510, respectively. In this single-module configuration, a continuity module 520 with electrical traces 525 interconnects the primary interface link groups associated with signals DQu to link groups DQt[31:0], which extend via the far connector 510 to half the contacts of primary data interface 150 of the one installed DRAM module 115. Motherboard 505 and continuity module 520 thus provide point-to-point data connections between controller component 110 and primary data interface 150. Module 115 is as detailed previously and can support the modes detailed in connection with FIGS. 3A, 3B, and 4A-4C.

Figure 5B:
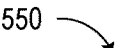
FIG. 5B depicts a memory system 550 in which the same motherboard 505 of FIG. 5A is populated with two memory modules 115A and 115B.

FIG. 5B depicts a memory system 550 in which the same motherboard 505 of FIG. 5A is populated with two memory modules 115A and 115B. Each memory module 115A and 115B is in a half-width mode, meaning that half of the primary data links of primary data interface 150 are used to communicate data and the other half are inactive. Only one of the two primary link groups for each data-buffer component 135 is used (e.g., primary buffer link group DQbp[3:0] of slice 125[0]), and motherboard 505 connects only half of the contacts in each primary data interface 150 to controller component 110. In particular, memory module 115A communicates with controller component 110 via primary data ports DQu and the corresponding half of primary link groups DQp[71:0], and memory module 115B communicates with controller component 110 via primary data ports DQv and the other half of the primary link groups. These connections are point-to-point, so memory modules 115A and 115B exhibit a lower load on the data link groups than systems in which two modules share the same data links. Links DQt [31:0] are not used in this dual-module configuration.

FIG. 6A depicts memory slice 125[0] with one DRAM component 130B and a subset of the signal lines highlighted to illustrate how multiplexers 200, 205, and 210 convey data between primary data link group DQbp[3:0] and one DRAM component in a half-width mode. Address buffer 140, via secondary command interface QCAB, selects one of the four DRAM components, the rightmost component 130B in this example. Responsive to signals on buffer control interface BCOM, multiplexers 200, 205, and 210 communicate read and write data between the low-order primary link group DQbp[3:0] and the selected DRAM component; the high-order link group DQbp[7:4] of the primary data interface is not connected to controller component 110 and is not used in this half-width mode.

Figure 6B:
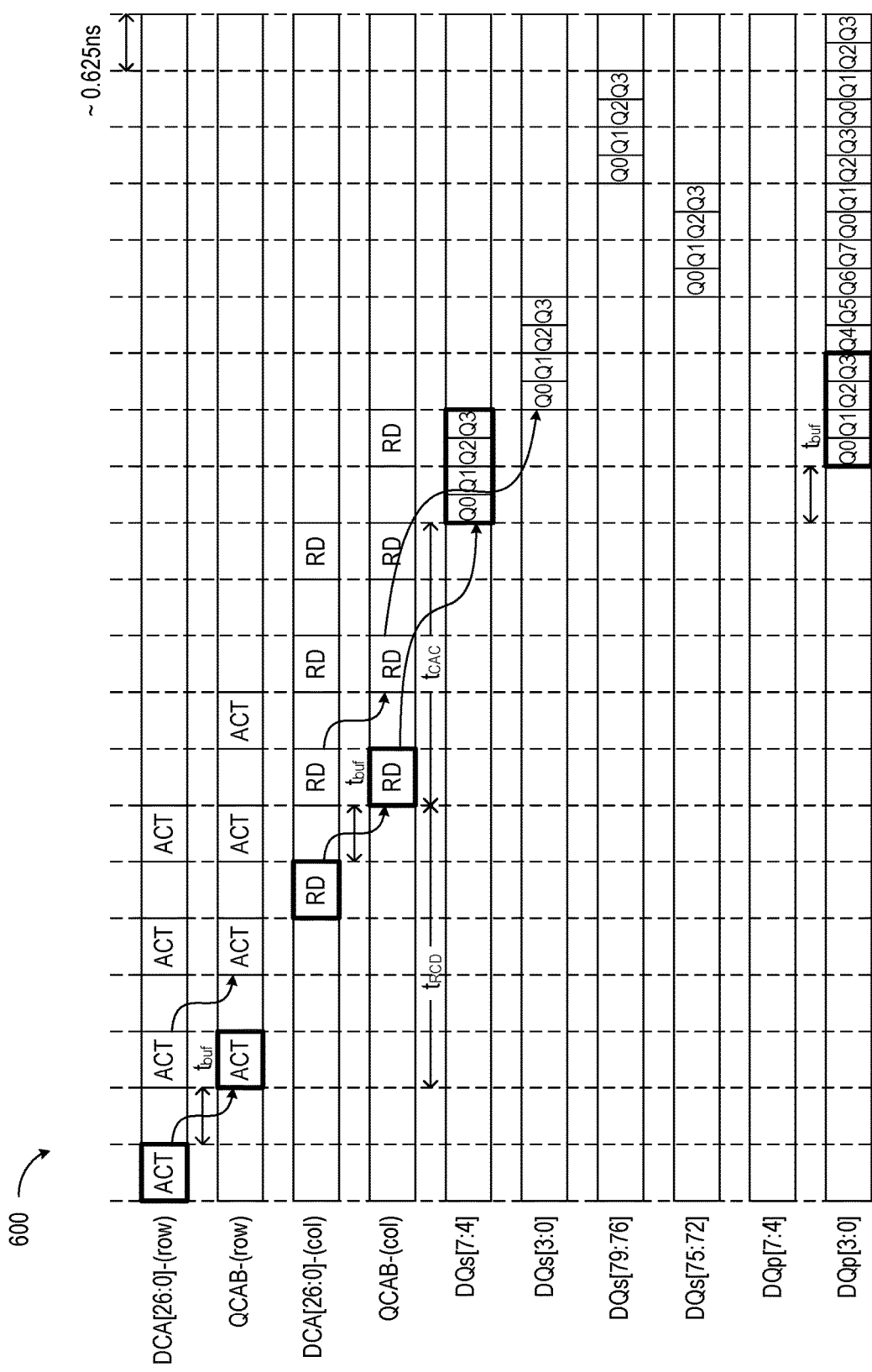
FIG. 6B is a waveform diagram 600 illustrating successive read transactions directed to memory slice 125[0] configured as illustrated in FIG. 6A.

FIG. 6B is a waveform diagram 600 illustrating successive read transactions directed to memory slice 125[0] configured as illustrated in FIG. 6A. Signals associated with the first read transaction are encompassed in bold boundaries to distinguish them from those of the second read transaction. The interaction of controller component 110 and slice 125[0] is similar to what is detailed above in connection with FIG. 3B, except that address-buffer component 140 only activates one of DRAM components 130A and 130B, and slice 125[0] only employs the low-order link group DQp[3:0] of the primary data interface. Stated differently, each slice is configured to deliver half-width data. Each module 115A and 115B (FIG. 5B) thus provides data in four-bit bursts of nine data nibbles (36 bits), collectively four-bit bursts of 72 bits, to controller component 110.

FIG. 7A depicts memory slice 125[0] with DRAM components 130A and the signal lines highlighted to illustrate how multiplexers 200, 205, and 210 convey data between primary link group DQbp[3:0] and a pair of DRAM components in a half-width TDM mode that supports enhanced EDC. Secondary command interface QCAB selects two DRAM components, both anterior components 130A in this example. Slice 125[0] operates in the manner noted above in connection with FIGS. 4A and 4B, but each memory transaction communicates with only two DRAM components. Data-buffer component 135 interleaves the data from the selected pair, with each of slices 125[8:0] thus communicating a burst of eight data nibbles for each read or write transaction initiated by controller component 110. Memory module 115 thus communicates eight sets of nine data nibbles (288 bits) in this half-width, enhanced EDC mode.

Figure 7B:
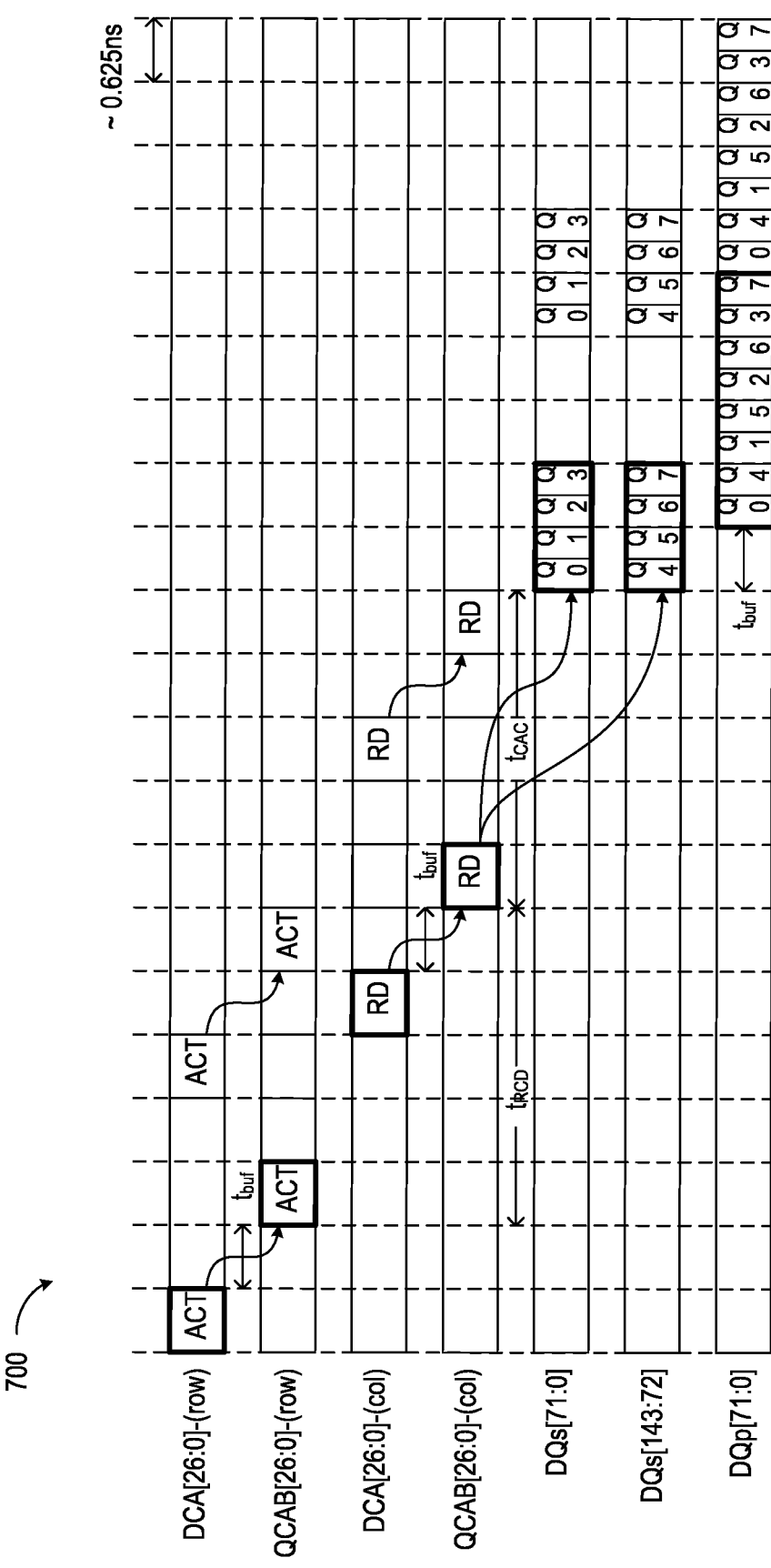
FIG. 7B is a waveform diagram 700 illustrating successive read transitions directed to memory slice 125[0] with memory module 115 in the enhanced EDC mode illustrated in FIG. 7A.

FIG. 7B is a waveform diagram 700 illustrating successive read transitions directed to memory slice 125[0] with memory module 115 in the enhanced EDC mode illustrated in FIG. 7A. Signals associated with the first read transaction are encompassed in bold boundaries to distinguish them from those of the second read transaction. The interaction of controller component 110 and slice 125[0] is similar to what is detailed above in connection with FIG. 4B, except that address-buffer component 140 only activates two of the four DRAM components 130A and 130B, and slice 125[0] only employs the low-order nibble of primary interface DQp[3:0]. Memory modules 115A and 115B collectively activate thirty-six DRAM components, a number sufficient for the enhanced EDC mode. Each of modules 115A and 115B (FIG. 5B) provides data in eight-bit bursts of 36 bits, allowing controller component 110 to communicate eight-bit bursts of 72 bits on primary data traces DQp[71:0] for each memory transaction.

Figure 7C:
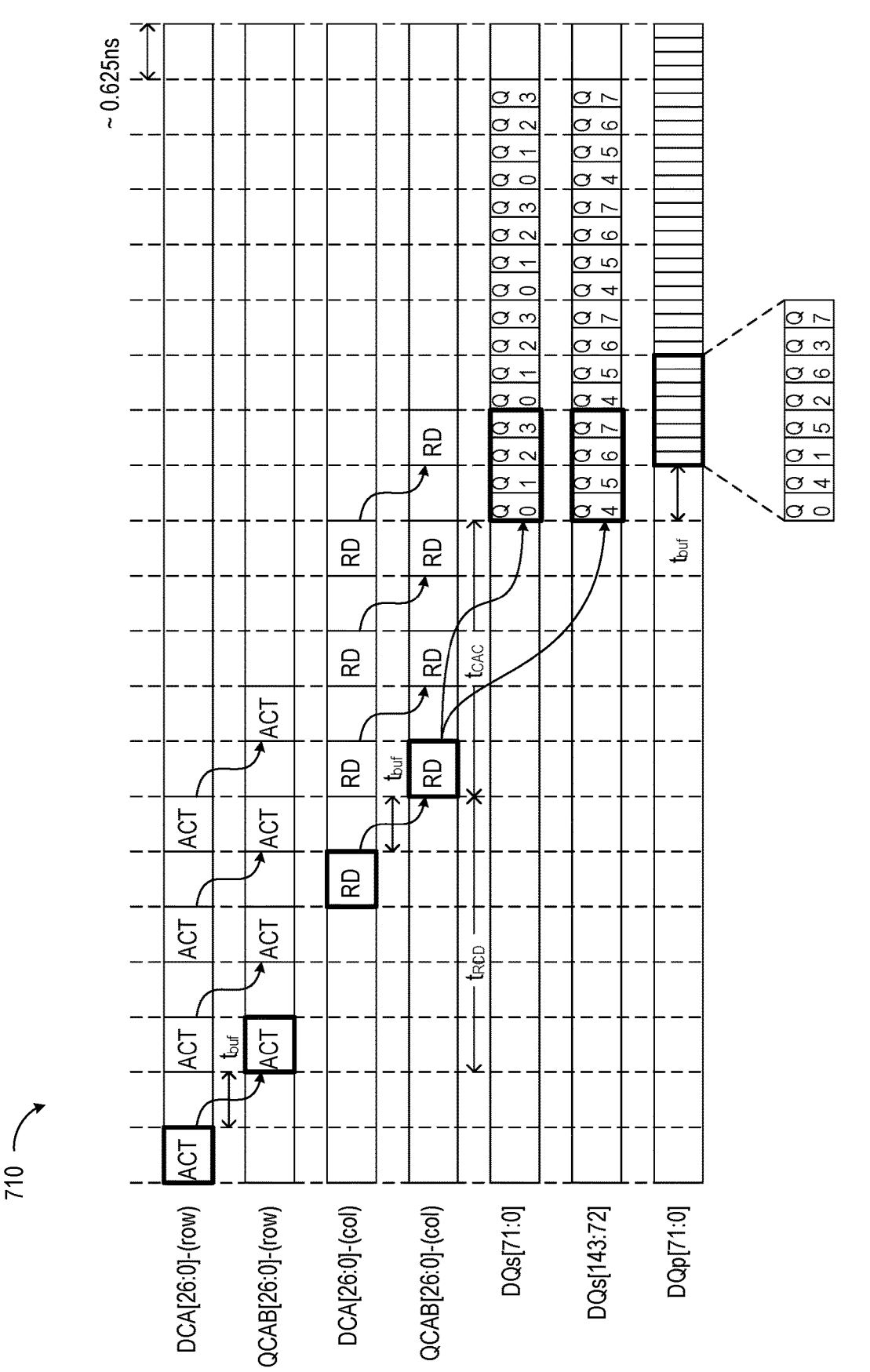
FIG. 7C is a waveform diagram 710 illustrating successive read transitions directed to memory slice 125[0] with memory module 115 in the half-width enhanced EDC mode illustrated in FIG. 7A.

FIG. 7C is a waveform diagram 710 illustrating successive read transitions directed to memory slice 125[0] with memory module 115 in the half-width enhanced EDC mode illustrated in FIG. 7A. Signals associated with the first read transaction are encompassed in bold boundaries to distinguish them from those of the second read transaction. This example is similar to that of FIG. 7B, but buffer 135 communicates over primary links DQp[71:0] at twice the bit rate of secondary links DQs[143:0].

Figure 8:
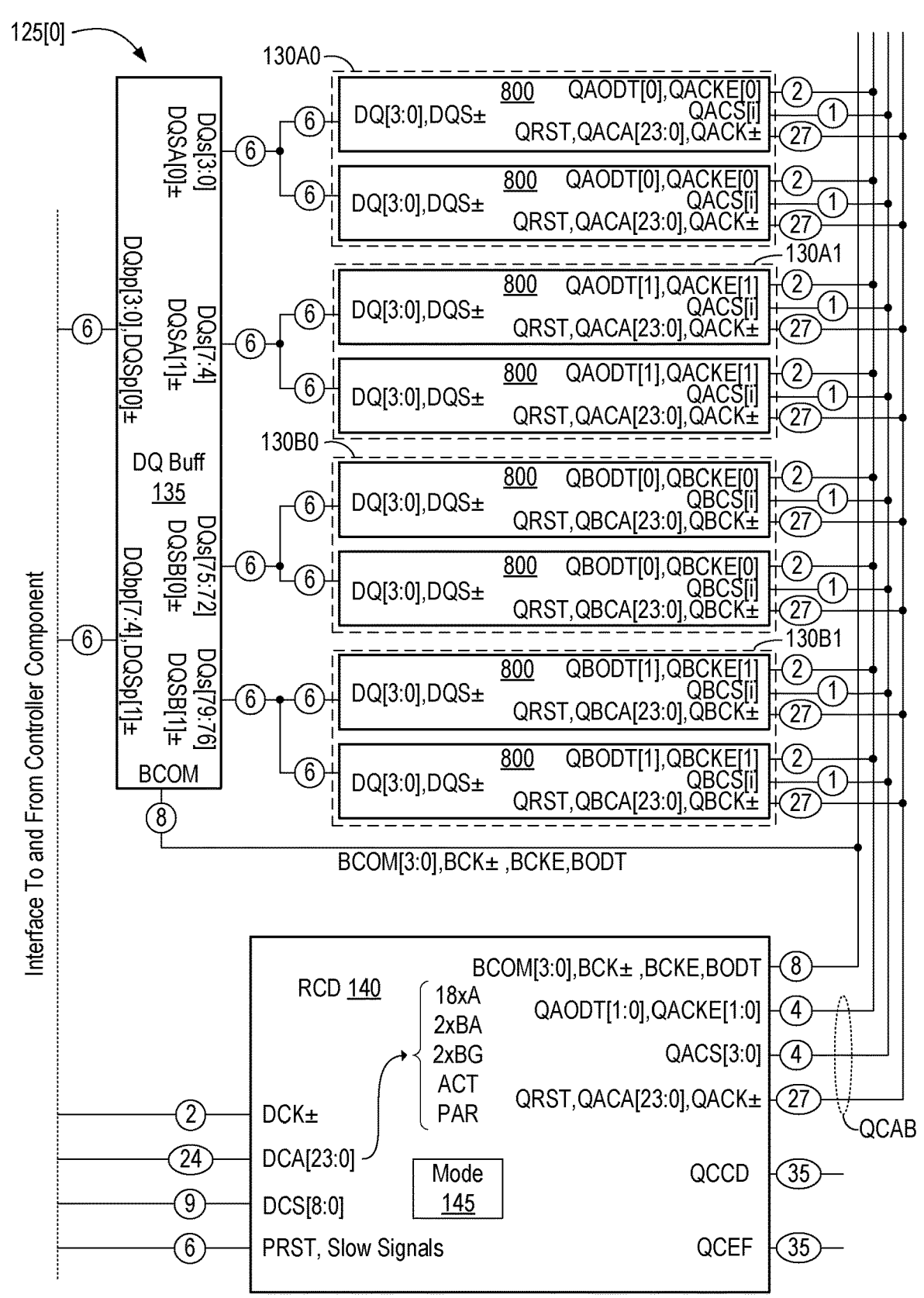
FIG. 8 details a portion of memory module 115, introduced in FIG. 1, highlighting features and connectivity that support width configurability and different EDC modes in accordance with one embodiment.

FIG. 8 details a portion of memory module 115, introduced in FIG. 1, highlighting features and connectivity that support width configurability and different EDC modes in accordance with one embodiment. Address-buffer component 140 is shown with one of the nine data-buffer components 135 and the four DRAM components 130 with which buffer 140 directly communicates. DRAM components 130 are distinguished using a two-place alphanumeric designation (A0, A1, B0, and B1).

Of the three secondary command interfaces QCAB, QCCD, and QCEF, only the interface QCAB coupled to the depicted slice is shown in detail; the other two are identical. Command interface QCAB includes multiple conductors with associated signals, to be discussed below. In this example, module 115 comprises a printed-circuit board, with components 205A0/B0 on one side and components 205A1/205B1 on the other.

Data-buffer component 135 includes two "nibble" data ports DQbp[3:0], DQSp[0]± and DQbp[7:4], DQSp[1]± on the primary side (or "processor" side), where "DQSp[#]±" specifies two-line complementary strobes; and includes four nibble data ports DQs[3:0], DQSA[0]±; DQs[7:4], DQSA[1]+; DQs[75:72], DQSB[0]±; and DQs[79:76], DQSB[1]± on the DRAM side (or "secondary" side). Commands issued on lines BCOM[3:0] steer and time data as required in the various operational modes. Signal BCK± is a complementary clock signal, BCKE is a clock-enable signal that allows Data-buffer component 135 to e.g. selectively power its interface circuits for improved efficiently, and BODT controls on-die-termination elements in Data-buffer component 135 for impedance matching. These signals are generally well documented and understood by those of skill in the art.

Each DRAM component 130 communicates with data-buffer component 135 via a data-and-strobe port DQ[3:0], DQS±, and communicates with address-buffer component 140 over secondary command interface QCAB via ports QAODT[#], QACKE[#], QACS[#]; and QRST, QACA[23:0], QA/BCK±. Components 130 may be conventional, and their input control signals and ports are well documented and understood by those of skill in the art. Briefly, signals QAODT[#] control the on-die termination values for each DRAM component 130; signals QA/BCKE[#] (the "CKE" for "clock-enable"), are used to switch components 130 between active and low-power states; QACS[i] are chip-select signals that determine which of dies 800 is active for a given memory transaction; QRST is a reset signal common to all components 130; QACA[23:0] are command and address signals; and QACK+ is a complementary clock signal that serves as a timing reference.

At the left in address-buffer component 140, the primary links (from controller 110) are CA links DCA[23:0], noted previously; complementary clock links DCK+ that provide timing reference to module 115; and chip-select links DCS [8:0] to specify ranks of memory components 130 for each memory transaction in the various modes. (In this context, a "rank" is a set of memory dies the controller accesses simultaneously to read and write data.) The "slow signals" that are connected to address-buffer component 140 are used for initialization and maintenance operations.

Link group DCA[23:0] includes eighteen address bits A, two bank-address bits BA, two bank-group address bits BG, an activate bit ACT, and a parity bit PAR. Address-buffer component 140 copies commands and addresses on links DCA[23:0] to links QACA[23:0] of secondary command interface QCAB. Address-buffer component 140 also copies chip-select information on the primary links DCS[3:0] to the requisite traces of link groups QACS[3:0].

Memory components 130A0 and 130A1 are on the front of module 115, whereas components 130B0 and 130B1 are on the back. Each memory component contains two DRAM dies 800 in this example, which can be stacked as noted in connection with FIG. 2. Other embodiments support more or fewer dies per site, depending e.g. on the DRAM packaging option.

Address-buffer component 140 conveys memory component sub-selection information to data-buffer component 135 via buffer command interface BCOM[3:0]. This signal instructs each data-buffer component 135 to access components 130A[1:0] or 130B[1:0], each of which includes a memory-component interface DQ[3:0] connected to a respective one of the four secondary data link groups DQs[3:0], DQs[7:4], DQs[75:72], and DQs[79:76]. Interface BCOM[3:0] can be used for other purposes, such as for initialization, maintenance, and testing.

Address-buffer component 140 includes a number of circuits that are omitted here. Such circuits may include a phase-locked loop, training and built-in self-test (BIST) logic, a command buffer, and a command decoder. These and other circuits are well understood by those of skill in the art, and details unrelated to the present disclosure are omitted for brevity.

Each data-buffer component 135 in the forgoing examples serves four memory components 130. Data buffers in accordance with other embodiments can serve more or fewer. Moreover, while the functions and connectivity provided by data-buffer components 135 and address-buffer component 140 are carried out on separate integrated circuits in the foregoing examples, some or all of the address-buffer functionality can be integrated with that of the data buffers.

Figure 9A:
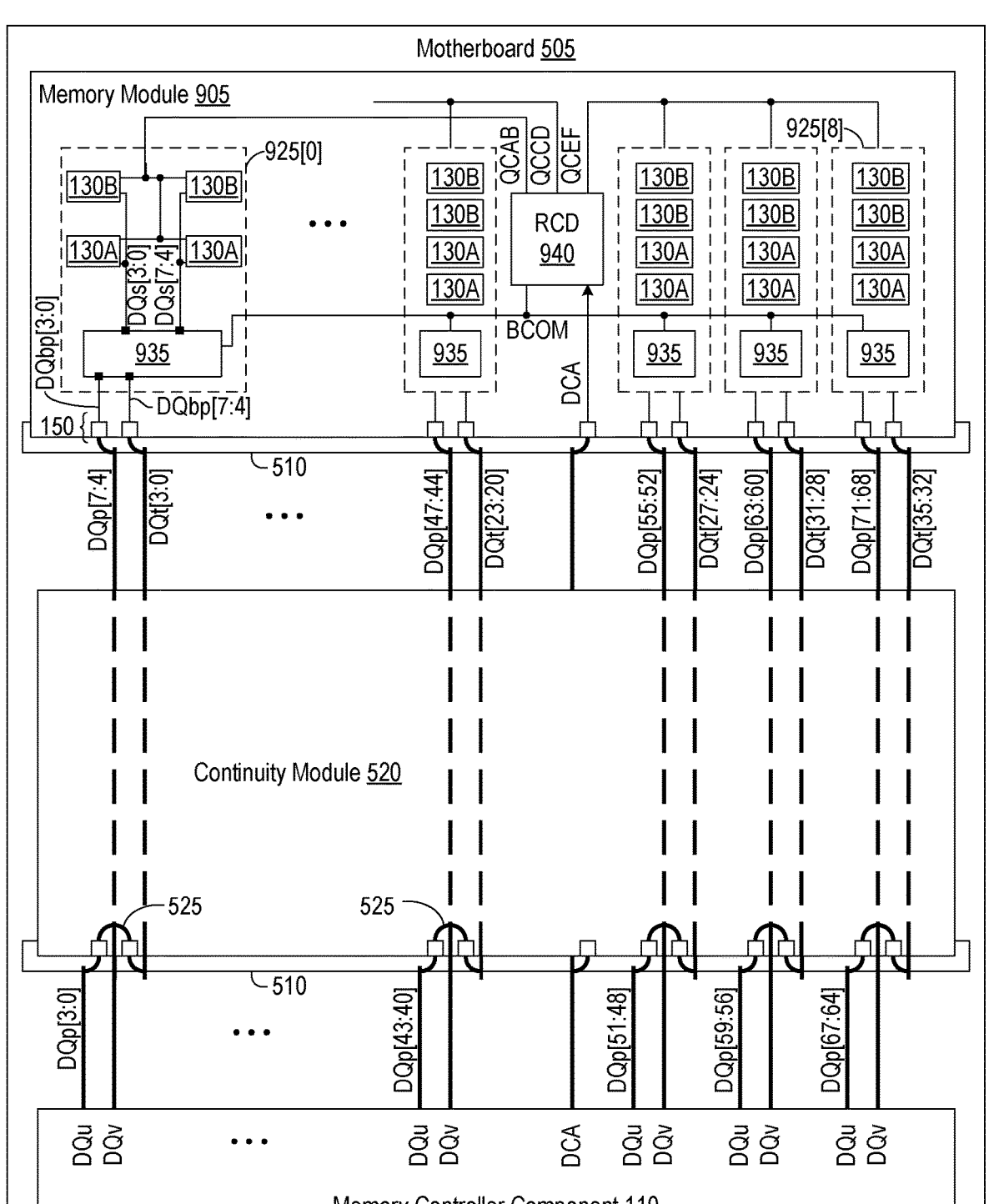

FIG. 9A depicts a memory system 900 similar to system 500 of FIG. 5A, with like-identified elements being the same or similar. As in that prior example, motherboard 505 includes two module connectors 510 and primary data links DQp[71:0] and DQt[35:0]. Half of primary links DQp[71:0] extend directly to the far connector 510; the other half extend to the far connector 510 via continuity module 520. System 900 thus provides point-to-point data connections between controller component 110 and primary data interface 150 of a single memory module 905.

Module 905 is largely as detailed previously. However, the data buffers 935 of module 905 have two—rather than four—secondary data interfaces (e.g., secondary interfaces DQs[7:4] and DQs[3:0]). Each of the secondary interfaces is coupled to a pair of DRAM components 130A and 130B. When configured in the full-width mode, as in this example, data buffers 935 communicate data, in the read and write directions, between the primary data interfaces and corresponding secondary data interfaces. Using the example of memory slice 925[0], data buffer 935 relays data between primary data link groups DQp[7:4] and DQt[3:0] and respective secondary data link groups DQs[3:0] and DQs[7:4]. In this mode, address buffer 940 alternatively activates either DRAM components 130A or 130B for each memory transaction to communicate seventy-two-bit data in bursts of four, or 288 bits. Of nine memory slices 925[8:0], one slice is used for EDC. As detailed below, data buffers 935 and address buffer 940 are modified to support multiple widths and multiple EDC modes.

Figure 9B:
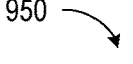
FIG. 9B depicts a memory system 950 in which the same motherboard 505 of FIG. 9A is populated with two memory modules 905A and 905B, each configured in a narrow, half-width mode.

FIG. 9B depicts a memory system 950 in which the same motherboard 505 of FIG. 9A is populated with two memory modules 905A and 905B, each configured in a narrow, half-width mode. As in the example of FIG. 5B, only one of the two primary link groups for each data-buffer component 935 is used, and motherboard 505 connects only half of the contacts in each primary data interface 150 to controller component 110. In particular, memory module 905A communicates with controller component 110 via primary data ports DQu and the corresponding half of primary link groups DQp[71:0], and memory module 905B communicates with controller component 110 via primary data ports DQv and the other half of the primary link groups.

Memory system 950 supports three EDC modes. The first EDC mode works in the manner detailed in connection with FIG. 6A, except that the switching provided by multiplexers 200 and 205 is omitted. Each memory transaction accesses one DRAM component 130 per memory slice 925[8:0], or eighteen DRAM component 130 between both modules. Each of modules 905A and 905B thus communicates thirty-six-bit data in bursts of four, or 144 bits, so that each memory transaction communicates 288 bits. Of eighteen memory slices 925[8:0], two are used for EDC.

The second EDC mode works in the manner detailed in connection with FIG. 7A, again excepting the switching provided by multiplexers 200 and 205. Address buffer 940 activates eighteen DRAM components 130 in each of memory modules 905A and 905B, or thirty-six total. DRAM components 130A are highlighted using bold boundaries to illustrate such an access. Each data buffer 935 interleaves four nibbles from each of a selected pair of memory components 130 to deliver eight-nibble bursts on one of the two primary data link groups. With reference to memory slice 925[0] of memory module 905A, for example, data buffer 935 interleaves four-nibble bursts from a pair of DRAM components 130A to deliver eight-nibble bursts on primary link group DQp[7:4]. Memory slice 925[0] of memory module 905B likewise delivers eight-nibble bursts on primary link group DQp[3:0]. As noted previously, primary links DQt[31:0] are not used in this or the other half-width modes.

Figure 9C:
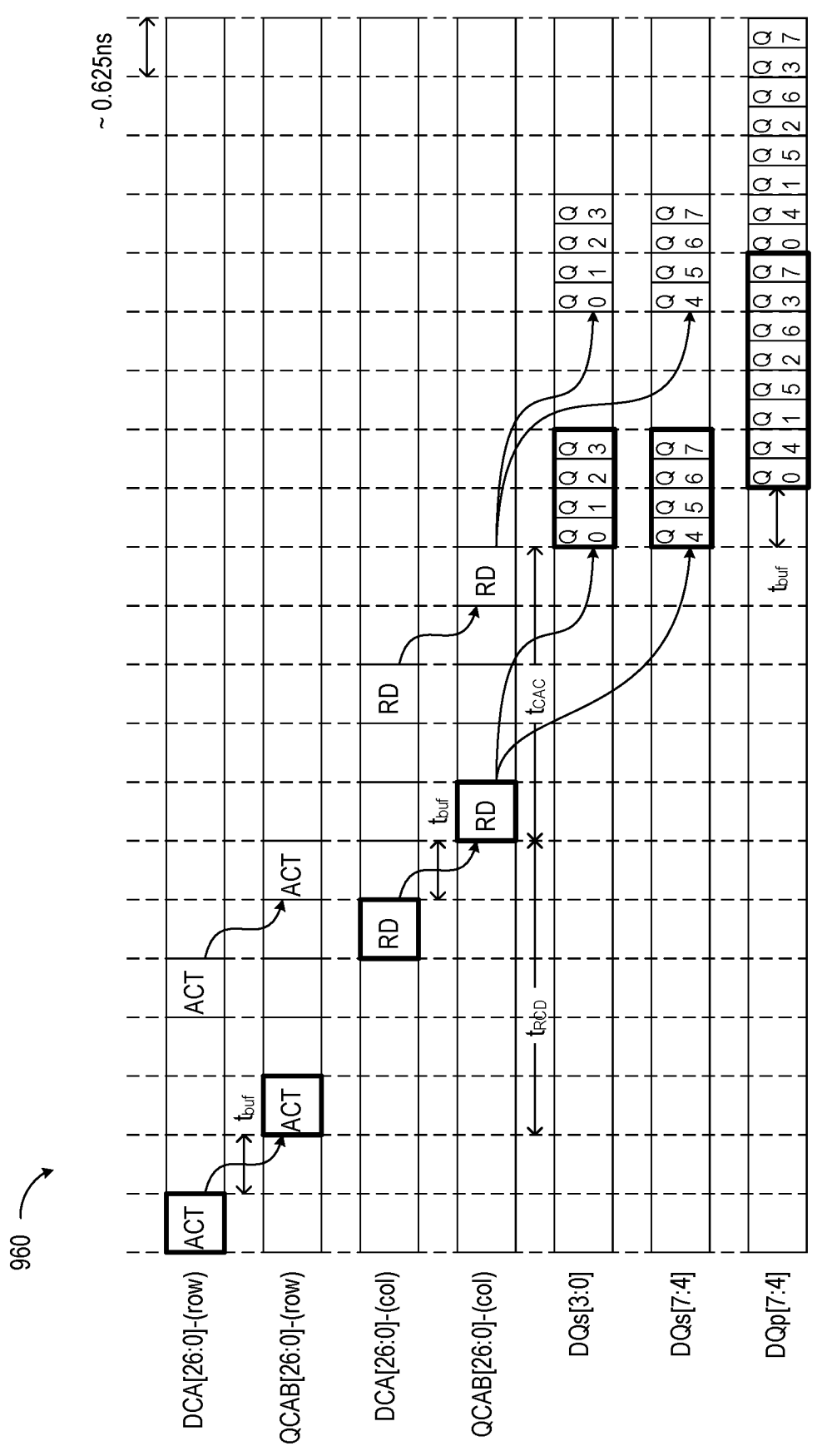
FIG. 9C is a waveform diagram 960 illustrating successive read transitions directed to memory slice 925[0] of memory module 905A of FIG. 9B in an enhanced EDC mode similar to that detailed previously in connection with FIG. 7A.

FIG. 9C is a waveform diagram 960 illustrating successive read transitions directed to memory slice 925[0] of memory module 905A of FIG. 9B in an enhanced EDC mode similar to that detailed previously in connection with FIG. 7A. Signals associated with the first read transaction are encompassed in bold boundaries to distinguish them from those of the second read transaction.

Address-buffer component 940 activates and reads from two DRAM components 130A, which simultaneously provide four-nibble bursts Q[3:0] and Q[7:4] on secondary interfaces DQs[3:0] and DQs[7:4], respectively. Data buffer 935 interleaves these nibbles to provide an eight-nibble burst Q[7:0] on primary data link group DQp[7:4]. Memory modules 905A and 905B collectively activate thirty-six DRAM components 130, a number sufficient for the enhanced EDC mode that corrects for any single DRAM device failure, and any multi-bit errors from any portion of a single DRAM device.

Bubbles between data bursts on the secondary data links (e.g., DQs[7:4] and DQs[3:0] of FIG. 9C) accommodate the fact that slice 925[0] has twice as many secondary data links as primary data links. On a second enhanced EDC mode similar to the one described in connection with FIG. 4C, data buffers 935 communicate over primary data links DQp[71:0] at twice the bit rate of secondary data links DQs[71:0]. This embodiment relaxes the speed requirements for DRAM components 130A and 130B, potentially reducing cost, power consumption, or both.

Figure 10A:
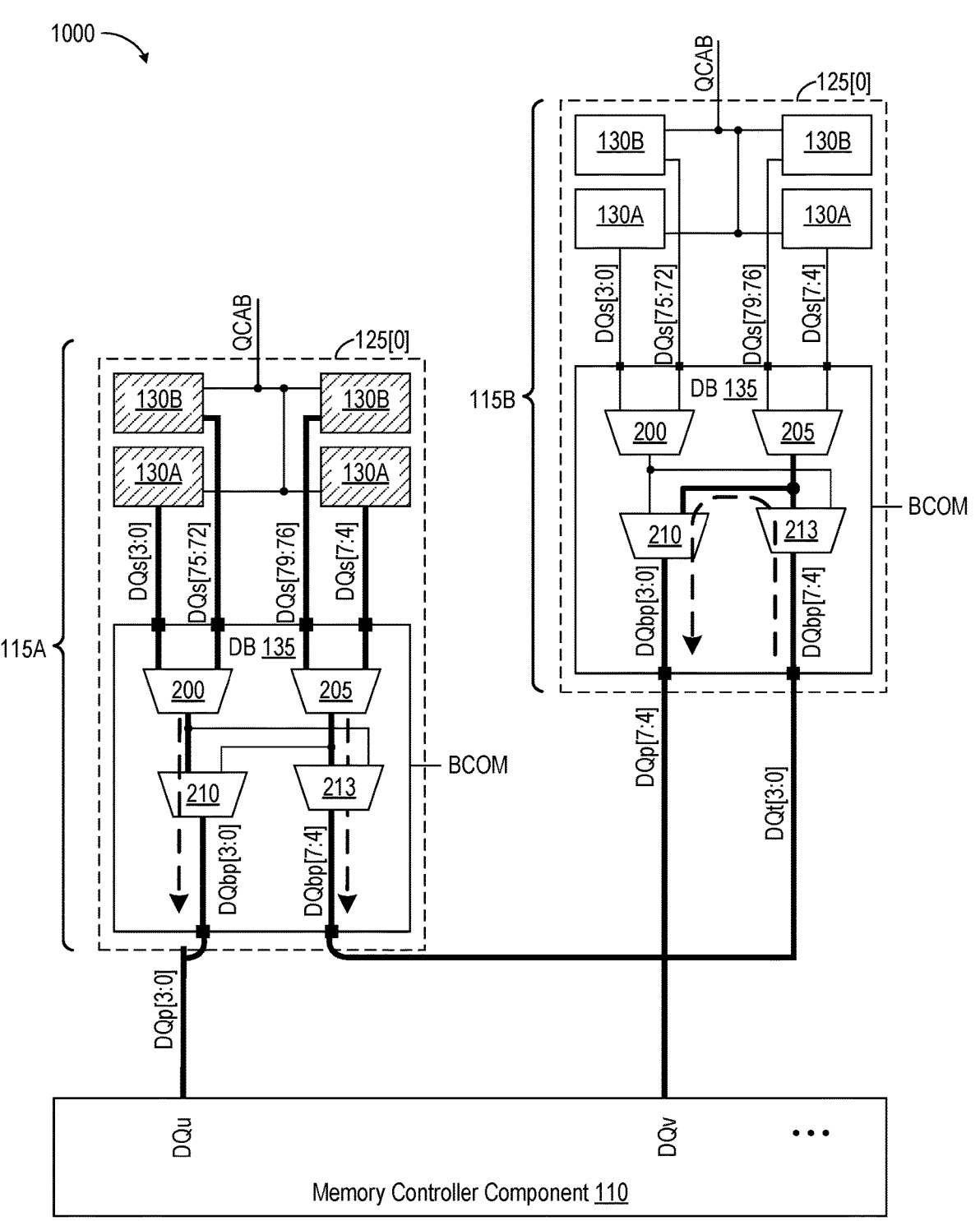
FIG. 10A depicts a memory system 1000 in which a pair of memory slices 125[0], one from each of two memory modules 115A and 115B, are configured to support a two-module enhanced EDC mode in which all the DRAM components 130 accessed in a single memory transaction are on the same module.

FIG. 10A depicts a memory system 1000 in which a pair of memory slices 125[0], one from each of two memory modules 115A and 115B, are configured to support a two-module enhanced EDC mode in which all the DRAM components 130 accessed in a single memory transaction are on the same module. Address-buffer component 140 (FIG. 1) activates a row in all four DRAM components 130A and 130B to present four-bit data on all four secondary data ports of data-buffer component 135. Data-buffer component 135 interleaves the data from the selected pairs of DRAM components 130 so that slice 125[0] communicates a burst of eight nibbles on each of primary buffer link groups DQbp[3:0] and DQbp[7:4].

The burst of low-order nibbles on buffer link group DQbp[3:0] is conveyed to a primary data port DQu of controller component 110 via primary link group DQp[3:0]. The burst of high-order nibbles on buffer link group DQbp [7:0] is conveyed to a primary data port DQv of controller component 110 via primary link group DQt[3:0], slice 125[0] of the other memory module 115B, and primary link group DQp[7:4]. None of memory components 130 in slice 125[0] of memory module 115B is activated; instead, data buffer 135 relays data on primary buffer link group DQbp [7:4] to primary buffer link group DQbp[3:0].

Relaying data through memory module 115B imposes an additional buffer delay $t_{buf}$ on the data from primary buffer link group DQbp[7:4]. Data buffer 135 in the active slice 125[0] imposes an additional buffer delay $t_{buf}$ on the burst from primary buffer link group DQbp[3:0], for a total delay $2t_{buf}$ to align the nibble-wide bursts to controller component 110. Slice 125[0] of memory module 115A thus communicates bursts of eight eight-bit words for each read or write transaction initiated by controller component 110.

Figure 10B:
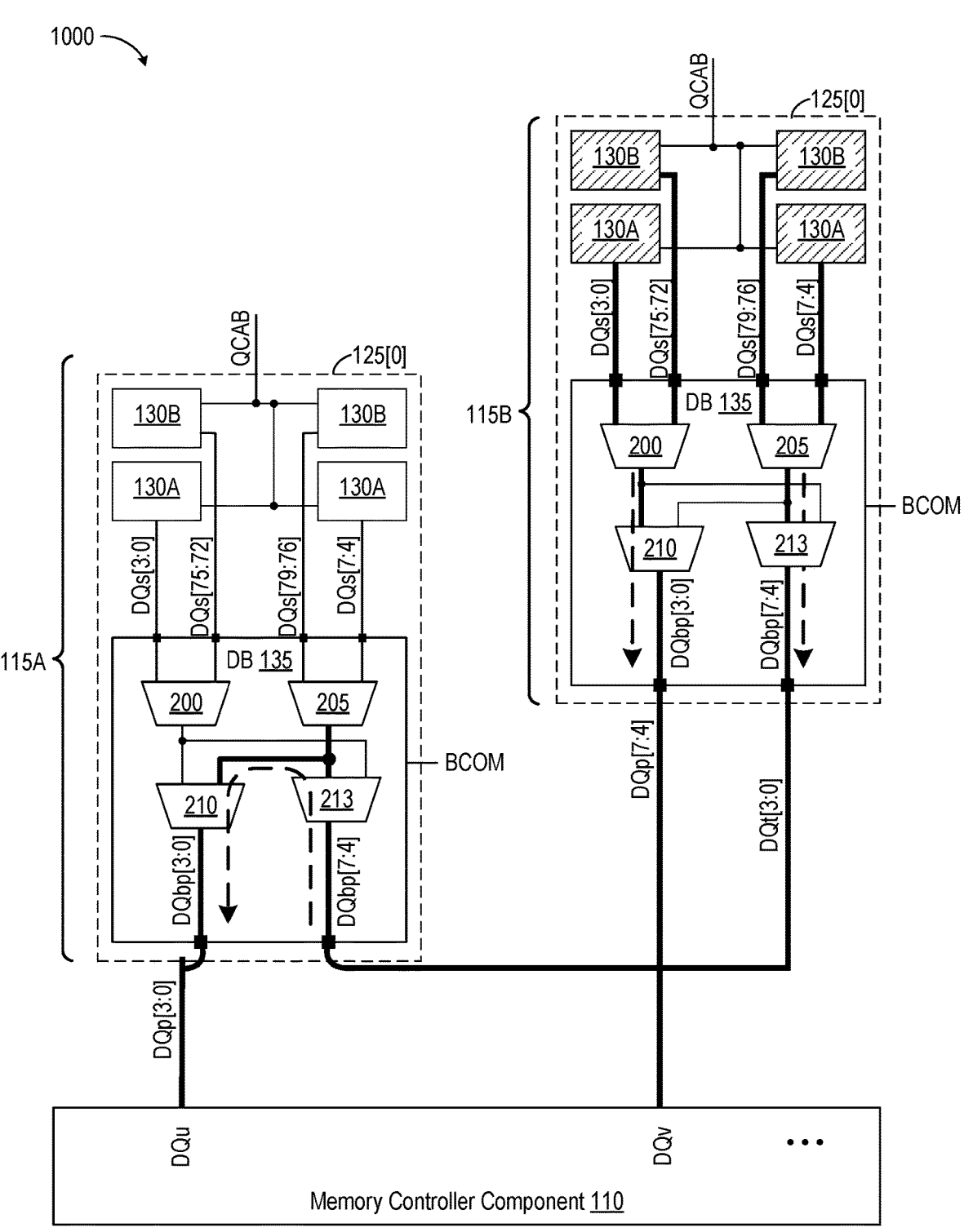
FIG. 10B depicts memory system 1000 of FIG. 10A with DRAM components 130 of slice 125[0] of module 115B activated in support of a memory transaction.

FIG. 10B depicts memory system 1000 of FIG. 10A with DRAM components 130 of slice 125[0] of module 115B activated in support of a memory transaction. Data buffer 135 in module 115A relays data on primary buffer link group DQbp[7:4] from memory module 115B to primary buffer link group DQbp[3:0]. Slice 125[0] of memory module 115B thus communicates bursts of eight eight-bit words for each read or write transaction initiated by controller component 110.

Figure 10C:
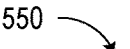
FIG. 10C is a more complete view of memory system 1000 of FIGS. 10A and 10B.

FIG. 10C is a more complete view of memory system 1000 of FIGS. 10A and 10B. Each memory module 115A and 115B is in a full-width mode. Only the low-order primary buffer link group in each data-buffer component 135 (e.g., DQbp[3:0]) is connected directly to controller component 110; the high-order primary buffer link group (e.g., DQbp[7:4]) is connected to controller component 110 via the other memory module. In this example, controller component 110 initiated a read transaction that activated all thirty-six memory components 130A and 130B in memory module 115A (the active memory components 130A and 130B are highlighted using bold boundaries). With thirty-six active components, controller component 110 can correct for any single DRAM device failure, and any multi-bit errors from any portion of a single DRAM device (e.g., Chipkill™ EDC).

Figure 10D:
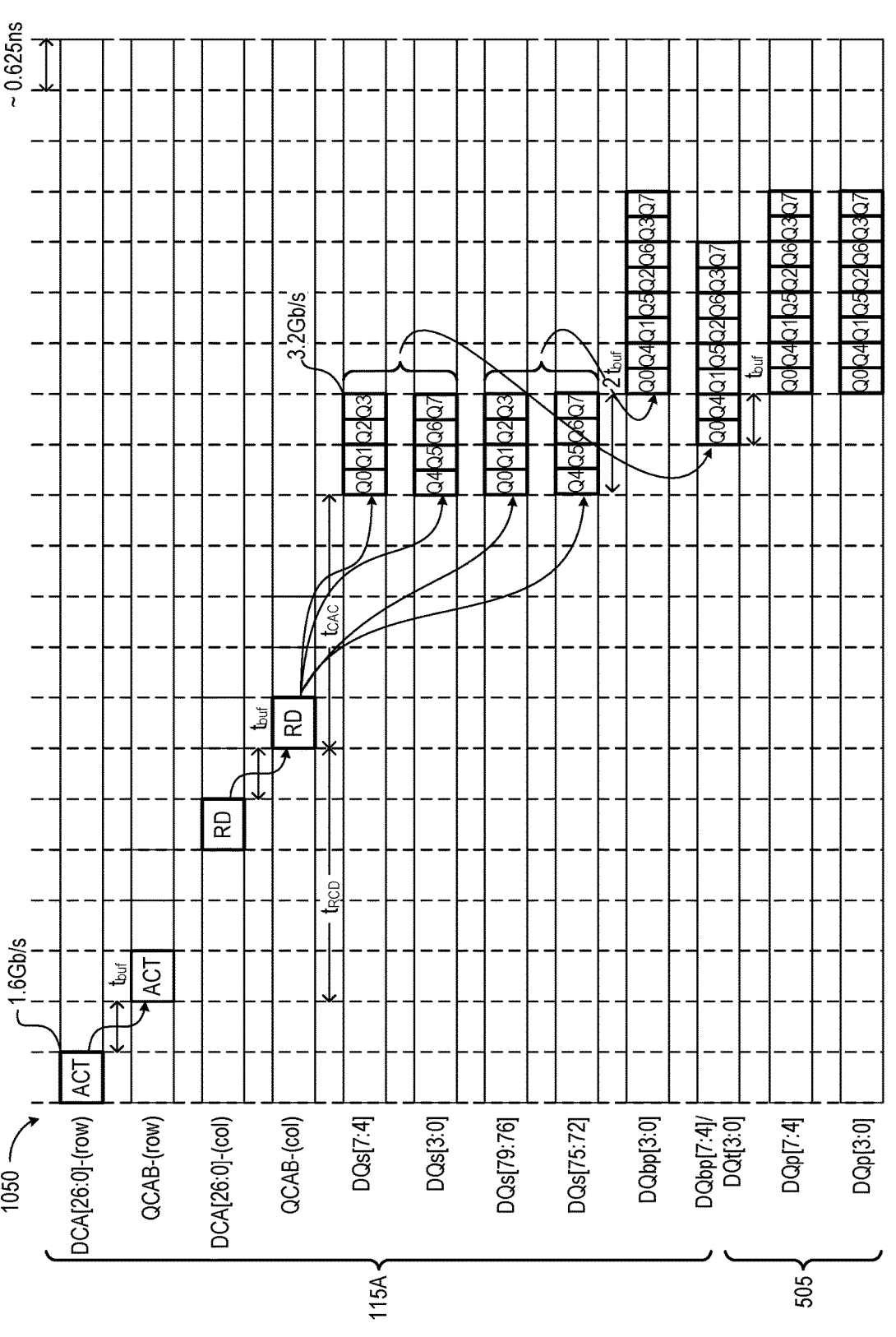
FIG. 10D is a waveform diagram 1050 illustrating a read transition directed to memory slice 125[0] of memory module 115A, as illustrated in connection with FIGS. 10A and 10C.

FIG. 10D is a waveform diagram 1050 illustrating a read transition directed to memory slice 125[0] of memory module 115A, as illustrated in connection with FIGS. 10A and 10C. To begin, controller component 110 issues an activate command ACT to modules 115A and 115B via CA traces DCA[26:0]. Responsive to this command, RCD 140 on memory module 115A activates a row of memory cells (not shown) in all four DRAM components 130A and 130B of slice 125[0]; and RCD 140 on memory module 115B prepares to forward signals from primary buffer link group DQbp[7:4] to primary buffer link group DQbp[3:0].

Having activated a row of memory cells in memory module 115A and prepared memory module 115B to forward data, controller component 110 issues a read command RD. Address buffer 140 of memory module 115A buffers these signals and issues them to slice 125[0] via secondary command interface QCAB to activate columns of the memory cells within the active rows.

Data-buffer component 135 in slice 125[0] of memory module 115A reads a burst of four nibbles from each of the four DRAM components 130A and 130B, on respective secondary link groups DQs[7:4], DQs[3:0], DQs[79:76], and DQs[75:72]. Data-buffer component 135 interleaves the data from secondary link groups DQs[7:4] and DQs[3:0] to provide a burst of eight nibbles on primary buffer data links DQbp[3:0], and thus primary data links DQp[3:0]. Data-buffer component 135 imposes a second buffer delay so that the data on primary buffer link group DQbp[3:0] and primary link group DQp[3:0] appears two buffer delays $2t_{buf}$ after the appearance of the data on the secondary link groups. Data-buffer component 135 also interleaves the data from secondary link groups DQs[79:76] and DQs[75:72] to provide a burst of eight nibbles on primary data links DQq[3:0]. Data-buffer component 135 only imposes one buffer delay $t_{buf}$; however, the slice 125[0] in the other module 115B (see FIGS. 10A and 10C) imposes a second buffer delay so that the data on primary link group DQp[7:4] appears two buffer delays $2t_{buf}$ after the appearance of the data on the secondary link groups. The eight-nibble bursts on primary link groups DQp[7:4] and DQp[3:0] are thus aligned. In other embodiments data buffers 135 communicate over primary link groups DQp and DQt at twice the bit rate relative to the bit rate employed with secondary links DQs[143:0].

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, circuits or devices and the like may be different from those described above in alternative embodiments.

Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments.

Circuitry within integrated circuit devices may be implemented using metal oxide semiconductor (MOS) technology, bipolar technology, or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition).

An output of a process for designing an integrated circuit, or a portion of an integrated circuit, comprising one or more of the circuits described herein may be a non-transitory computer-readable medium such as, for example, a magnetic tape or an optical or magnetic disk. The non-transitory computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted.

Mode selection may include, for example and without limitation, loading a control value into a register or other storage circuit in response to a host instruction, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. A method of reading from a memory system having first memory components on a first memory module and a second memory components on a second memory module, the method comprising:

receiving a read command, addressed to the first memory module, at the first memory module and the second memory module;

the first memory module, responsive to the read command:

reading first and second data from the first memory components;

sending the first data to a memory controller; and sending the second data to the second memory module; and the second memory module, responsive to the read command:

holding the second memory components in a low-power mode; and forwarding the second data to the memory controller.

2. The method of claim 1, wherein the second memory module introduces a module delay in the second data, the method further comprising the first memory module, responsive to the read command, adding the module delay to the first data to align the first data with the second data.

3. The method of claim 1, the first memory module, responsive to the read command, interleaving the first data from ones of the first memory components and the second data from others of the first memory components.

4. The method of claim 3, wherein the interleaving comprises time-division multiplexing.

5. The method of claim 1, further comprising:

receiving a second read command addressed to the second memory at the second memory module and the second memory module;

the second memory module, responsive to the second read command:

reading third and fourth data from the second memory components;

sending the third data to the memory controller; and sending the fourth data to the first memory module; and the first memory module, responsive to the second read command:

holding the first memory components in the low-power mode; and forwarding the fourth data to the memory controller.

6. The method of claim 5, wherein the first memory module introduces the module delay in the third data, the method further comprising the second memory module, responsive to the second read command, adding the module delay to the third data.

7. The method of claim 6, the first memory module, responsive to the read command, interleaving the third data from ones of the second memory components and the fourth data from others of the second memory components.

8. A memory system comprising:

a memory controller to issue a read command;

a first memory module coupled to the memory controller to receive the read command, the first memory module having first memory components, a first data buffer coupled to the first memory components; and a first address buffer coupled to the first memory components and the first data buffer; and a second memory module coupled to the memory controller to receive the read command, the second memory module having second memory components, a second data buffer coupled to the second memory components; and a second address buffer coupled to the second memory components and the second data buffer;

the first address buffer, responsive to the read command, directing the first data buffer to read first and second data from the first memory components, send the first data to the memory controller; and send the second data to the second memory module; and the second address buffer, responsive to the read command, holding the second memory components in a low-power mode and directing the second data buffer to forward the second data to the memory controller.

9. The memory system of claim 8, wherein the second data buffer introduces a module delay in the second data and the first data buffer adds the module delay to the first data to align this first data with the second data.

10. The memory system of claim 8, the first data buffer to interleave the first data from ones of the first memory components.

11. The memory system of claim 10, wherein the interleaving comprises time-division multiplexing.

12. The memory system of claim 11, the memory controller to issue a second read command:

the second address buffer, responsive to the second read command, directing the second data buffer to read third data and fourth data from the second memory components, send the third data to the memory controller, and send the fourth data to the first memory module; and the first address buffer, responsive to the second read command, holding the first memory components in the low-power mode and directing the first data buffer to forward the fourth data to the memory controller.

\* \* \* \* \*